(12) United States Patent
Han

(10) Patent No.: US 10,362,690 B2
(45) Date of Patent: Jul. 23, 2019

(54) DISPLAY APPARATUS

(71) Applicant: LG ELECTRONICS INC., Seoul (KR)

(72) Inventor: Jihoon Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/072,846

(22) PCT Filed: Mar. 9, 2016

(86) PCT No.: PCT/KR2016/002328
§ 371 (c)(1),
(2) Date: Jul. 25, 2018

(87) PCT Pub. No.: WO2017/142118
PCT Pub. Date: Aug. 24, 2017

(65) Prior Publication Data
US 2019/0037710 A1    Jan. 31, 2019

(30) Foreign Application Priority Data

Feb. 15, 2016   (KR) .................. 10-2016-0017321

(51) Int. Cl.
*G09F 9/30* (2006.01)
*H05K 5/02* (2006.01)
(Continued)

(52) U.S. Cl.
CPC ........... *H05K 5/0017* (2013.01); *B65H 16/00* (2013.01); *B65H 18/10* (2013.01); *G02F 1/1333* (2013.01);
(Continued)

(58) Field of Classification Search
CPC .. H05K 5/0017; H05K 5/0226; H05K 5/0217; B65H 16/00; B65H 18/10;
(Continued)

(56) References Cited

U.S. PATENT DOCUMENTS 9,098,241 B1 * 8/2015 Cho ...................... H05K 1/028
2013/0127799 A1   5/2013 Lee
(Continued)

FOREIGN PATENT DOCUMENTS

KR   1020140024145   2/2014
KR   1020140101124   8/2014
(Continued)

OTHER PUBLICATIONS

PCT International Application No. PCT/KR2016/002328, International Search Report dated Nov. 15, 2016, 4 pages.

*Primary Examiner* — Abhishek M Rathod
(74) *Attorney, Agent, or Firm* — Lee, Hong, Degerman, Kang & Waimey

(57) ABSTRACT

A display apparatus is disclosed including a housing; at least one roller disposed within the housing; a display unit comprising a display panel and a module cover; a motor assembly; an upper bar coupled to the upper portion of the display unit; a drive unit including at least one support unit, of which one end is coupled to both ends of the upper bar and the other end is coupled to the motor assembly, to raise the upper bar; and an encoder disposed to be spaced apart from the at least one roller within the housing, wherein the at least one support unit includes an upper link; a lower link; and a hinge for connecting the upper link and the lower link, and the encoder is coupled to a rotation axis of one end of the lower link.

14 Claims, 35 Drawing Sheets

(51) Int. Cl.
- *B65H 16/00* (2006.01)
- *H05K 5/00* (2006.01)
- *G02F 1/1333* (2006.01)
- *H01L 51/56* (2006.01)
- *B65H 18/10* (2006.01)
- *H01L 51/52* (2006.01)
- *F16C 11/04* (2006.01)

(52) U.S. Cl.
 CPC .............. *G09F 9/30* (2013.01); *H01L 51/524* (2013.01); *H01L 51/56* (2013.01); *H05K 5/0217* (2013.01); *H05K 5/0226* (2013.01); *F16C 11/04* (2013.01); *H01L 2251/5338* (2013.01)

(58) Field of Classification Search
 CPC .................... H01L 51/524; H01L 51/56; H01L 2251/5338; G09F 9/30; G02F 1/1333; F16C 11/04
 See application file for complete search history.

(56) References Cited

U.S. PATENT DOCUMENTS

| | | | |
|---|---|---|---|
| 2015/0029229 A1* | 1/2015 | Voutsas | G06F 1/1652 |
| | | | 345/661 |
| 2016/0374228 A1* | 12/2016 | Park | G09F 9/301 |
| 2017/0156225 A1* | 6/2017 | Heo | H05K 1/028 |
| 2017/0286042 A1* | 10/2017 | Lee | G06F 3/14 |
| 2017/0308346 A1* | 10/2017 | Lee | G06F 3/14 |

FOREIGN PATENT DOCUMENTS

| | | |
|---|---|---|
| KR | 1020140101611 | 8/2014 |
| KR | 1020160013289 | 2/2016 |

\* cited by examiner

[FIG. 1]
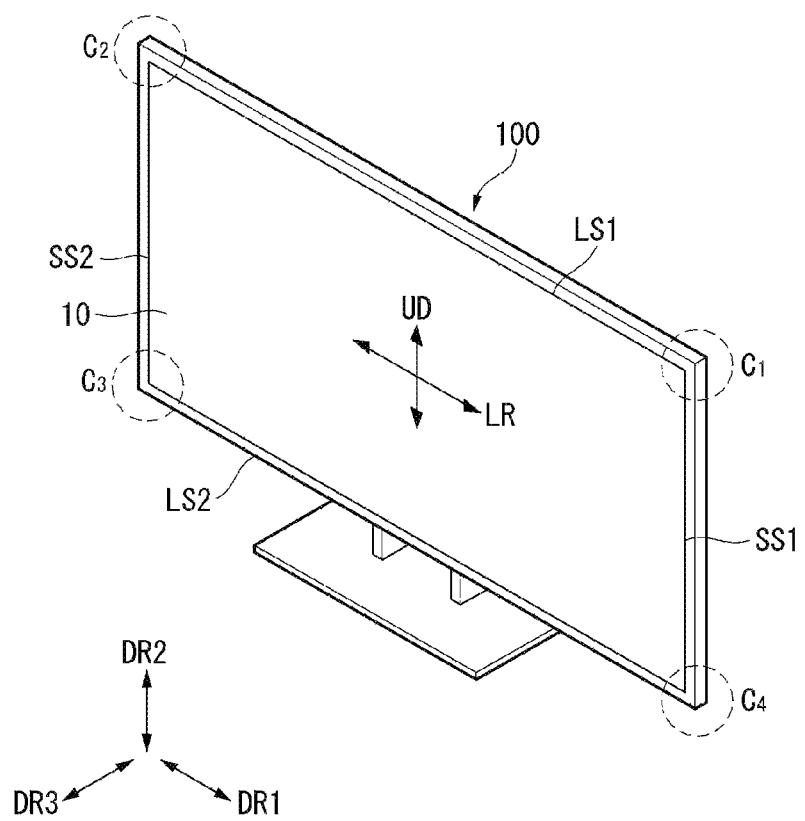

[FIG. 2]
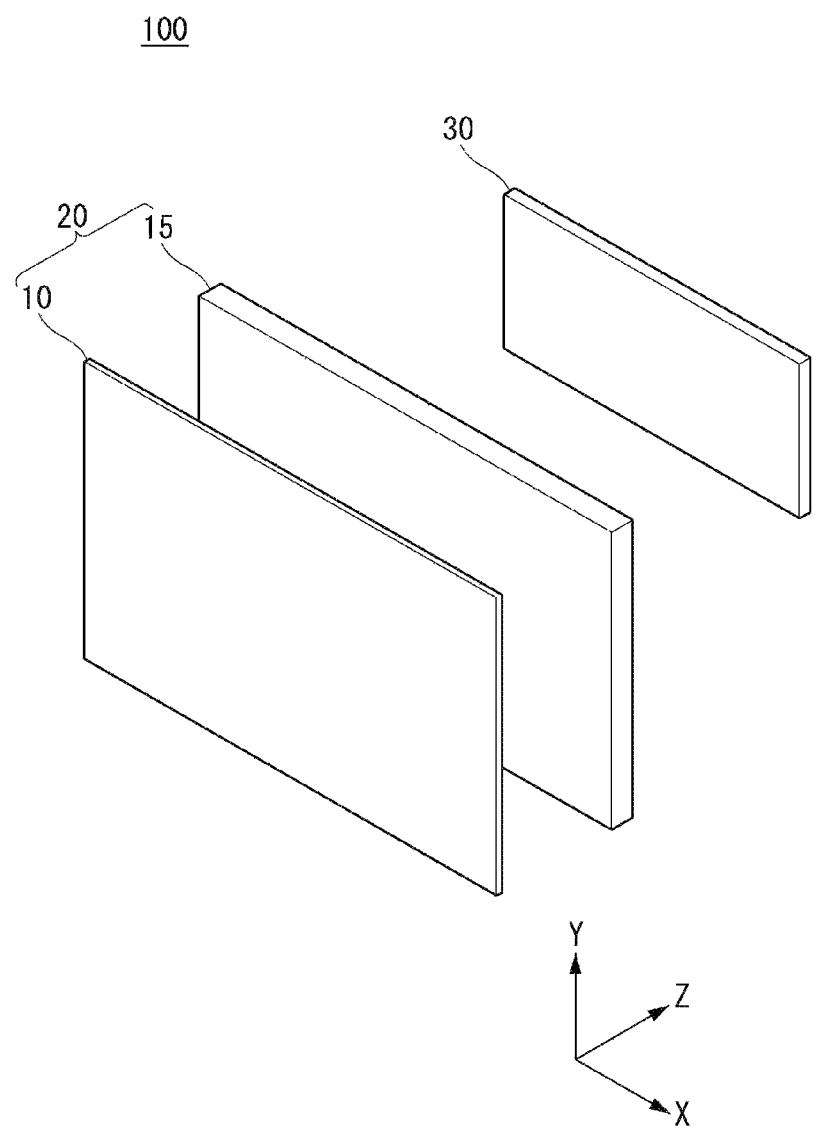

[FIG. 3]
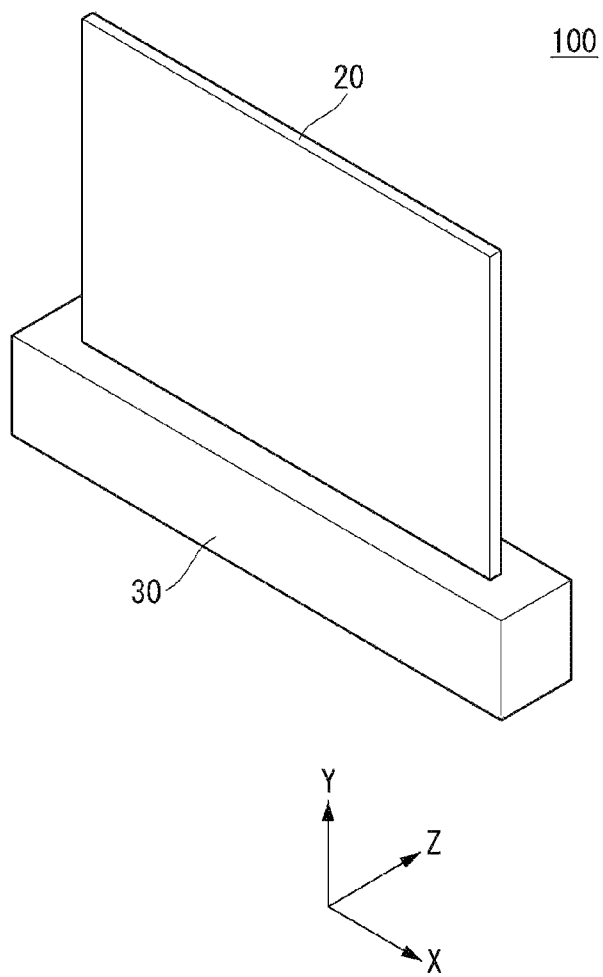

【FIG. 4】
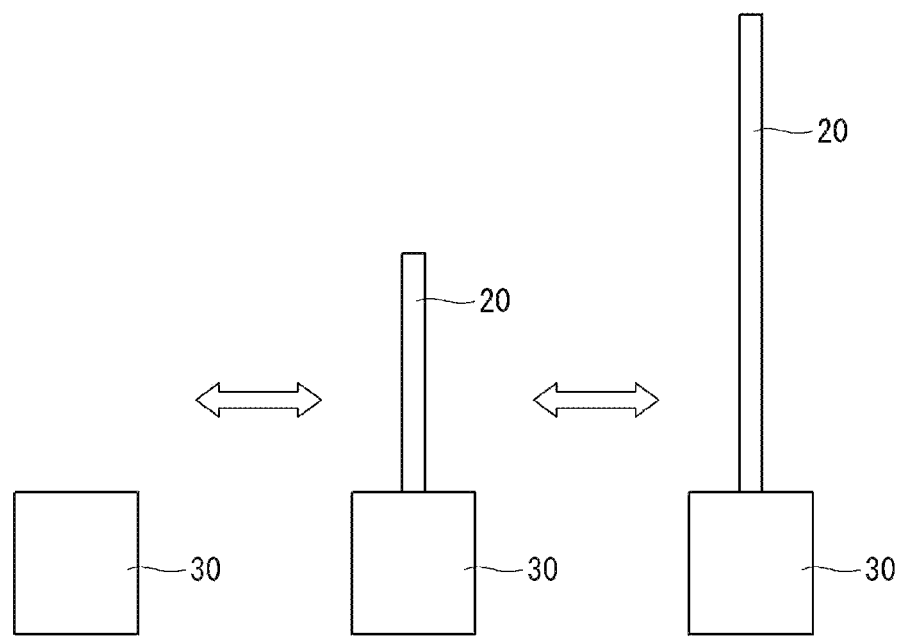

【FIG. 5】
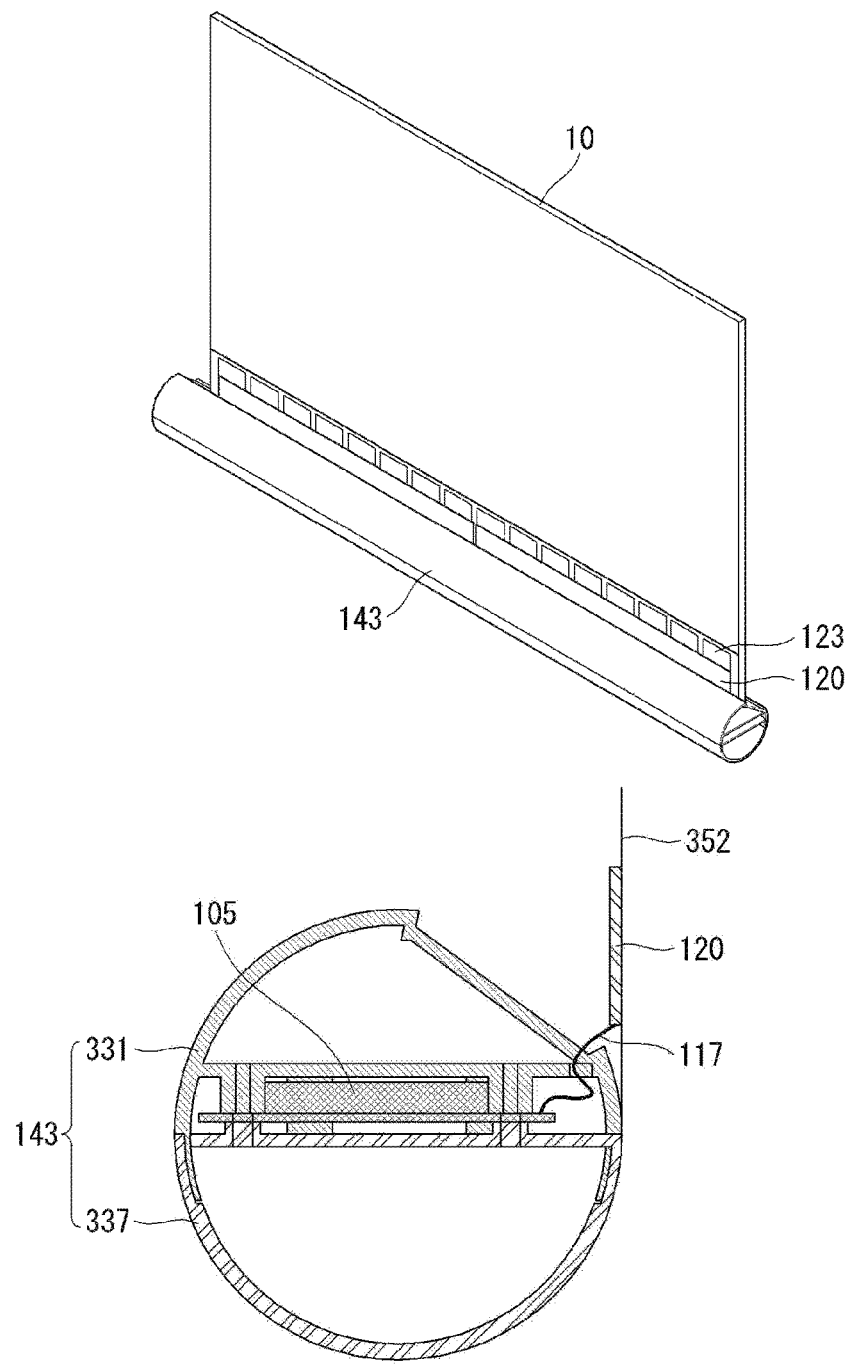

[FIG. 6]
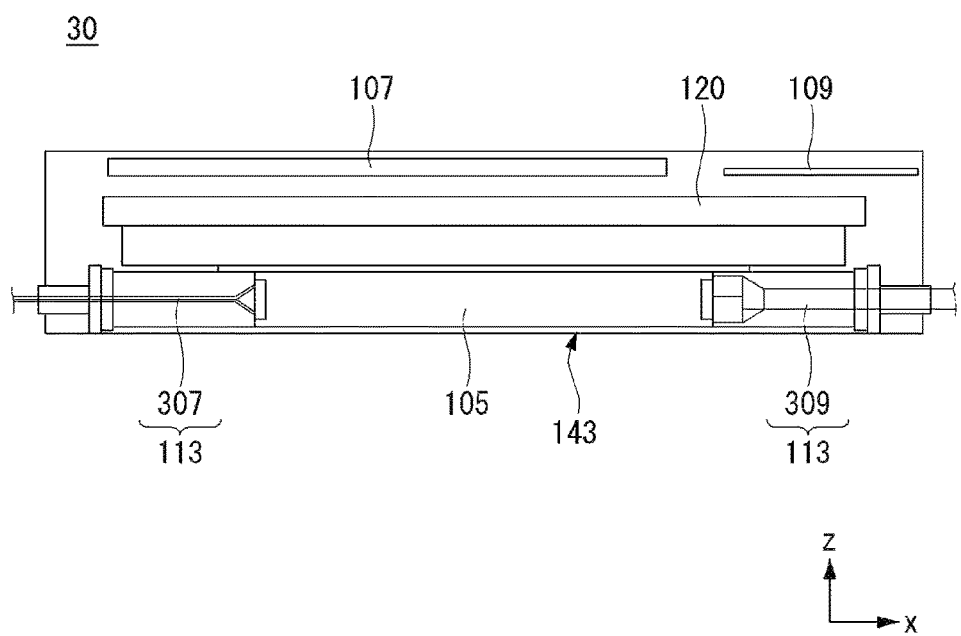

[FIG. 7]
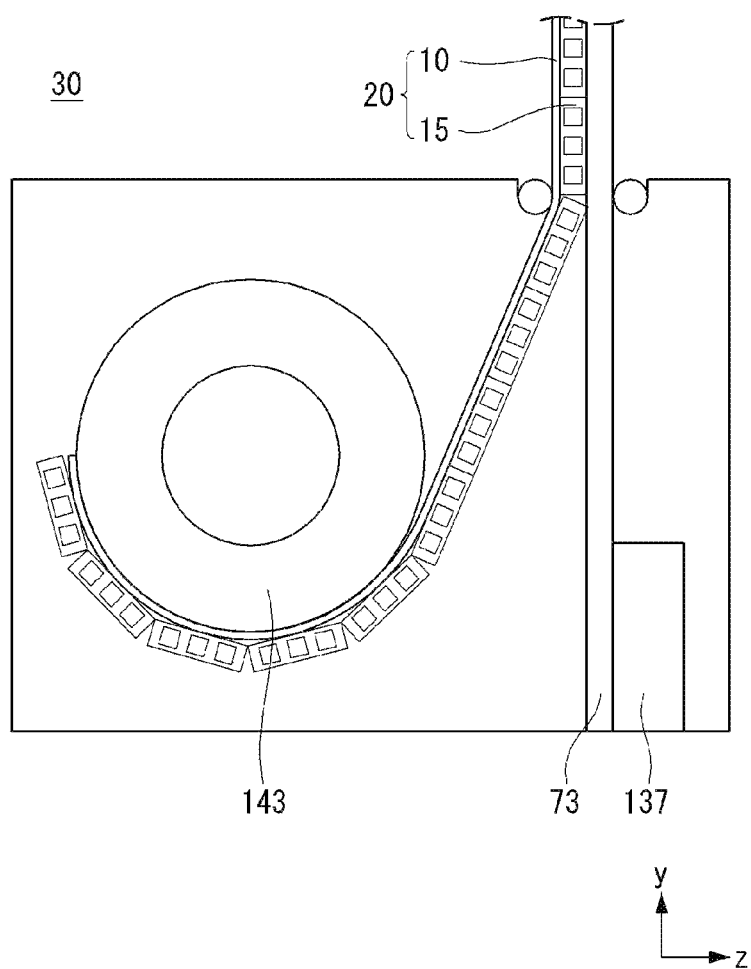

[FIG. 8]
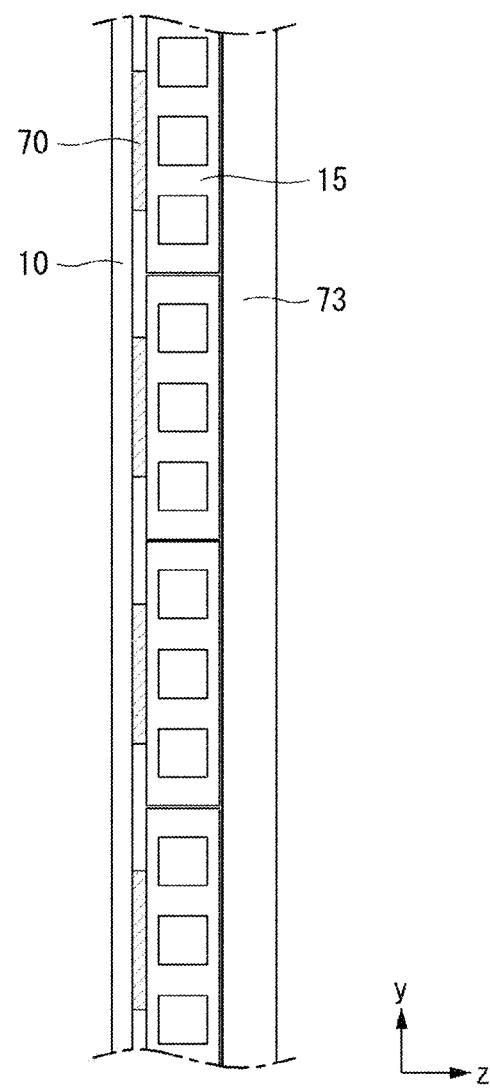

[FIG. 9]
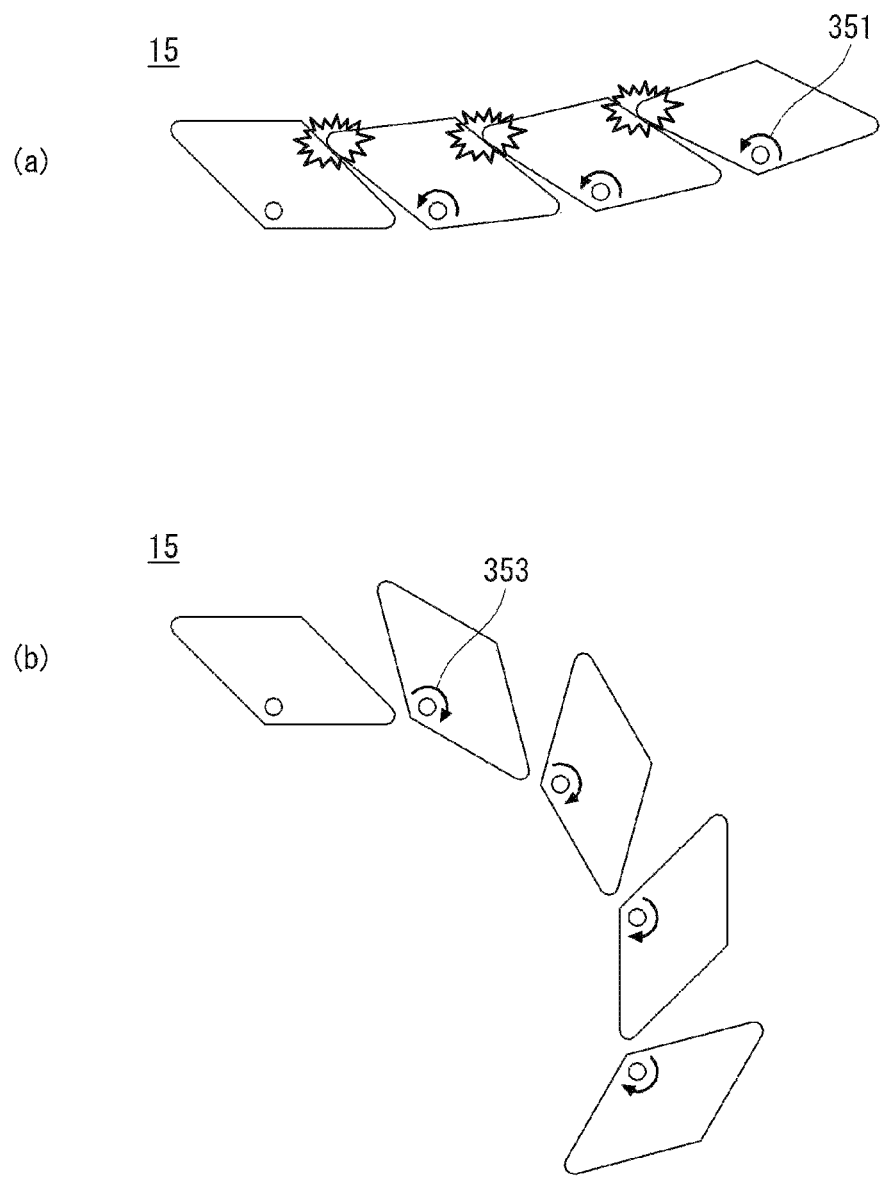

【FIG. 10】
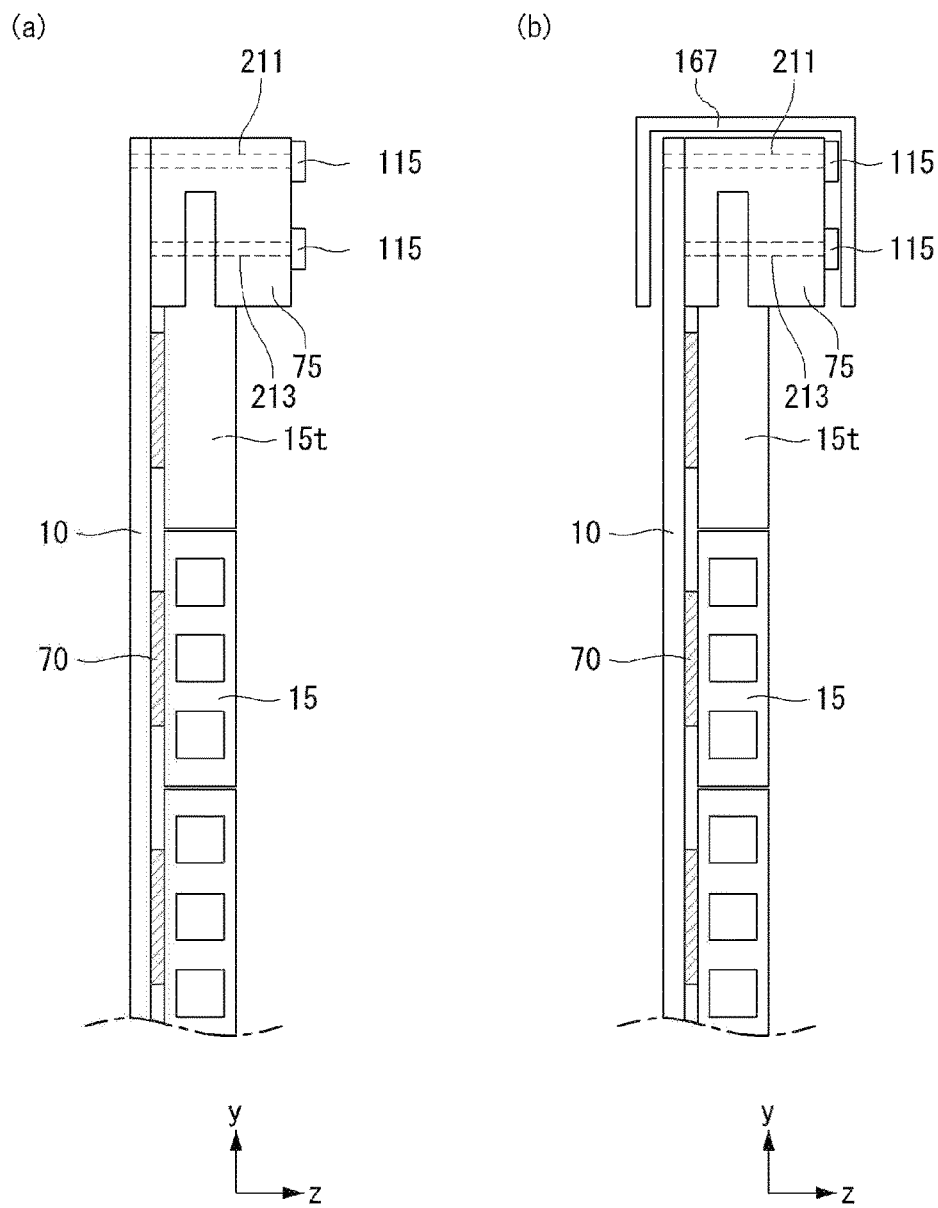

[FIG. 11]
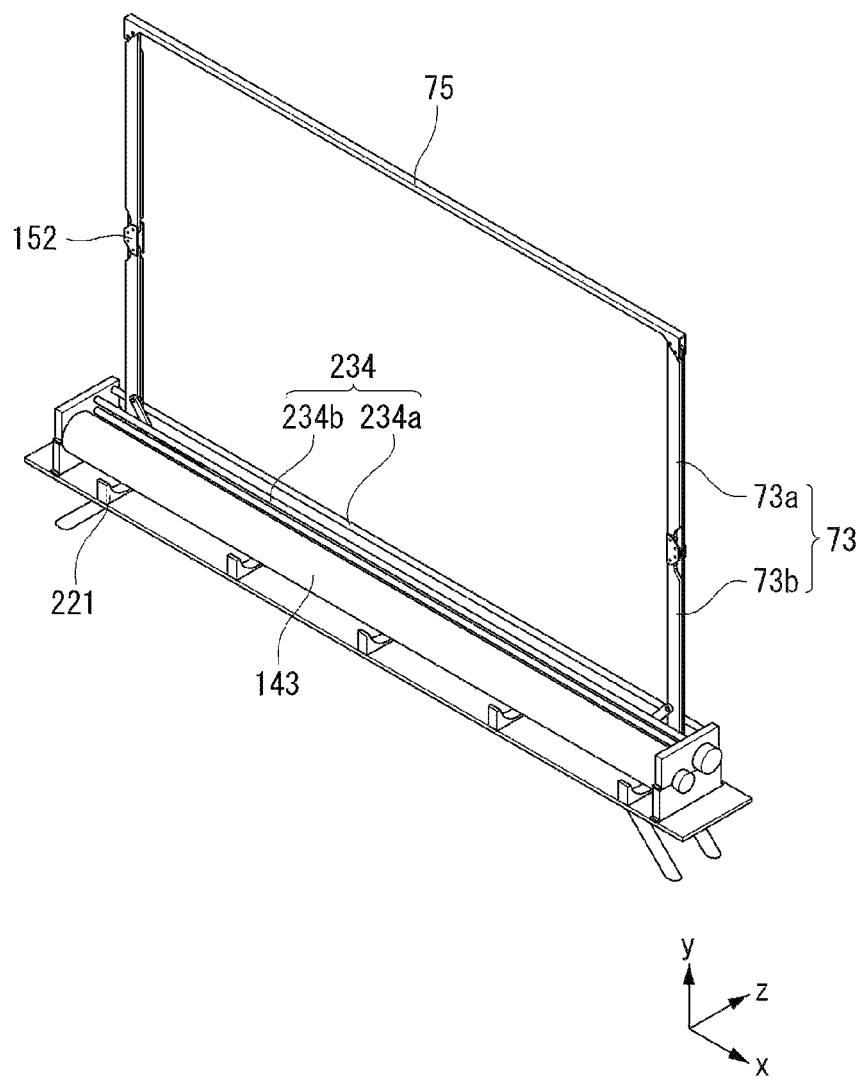

[FIG. 12]
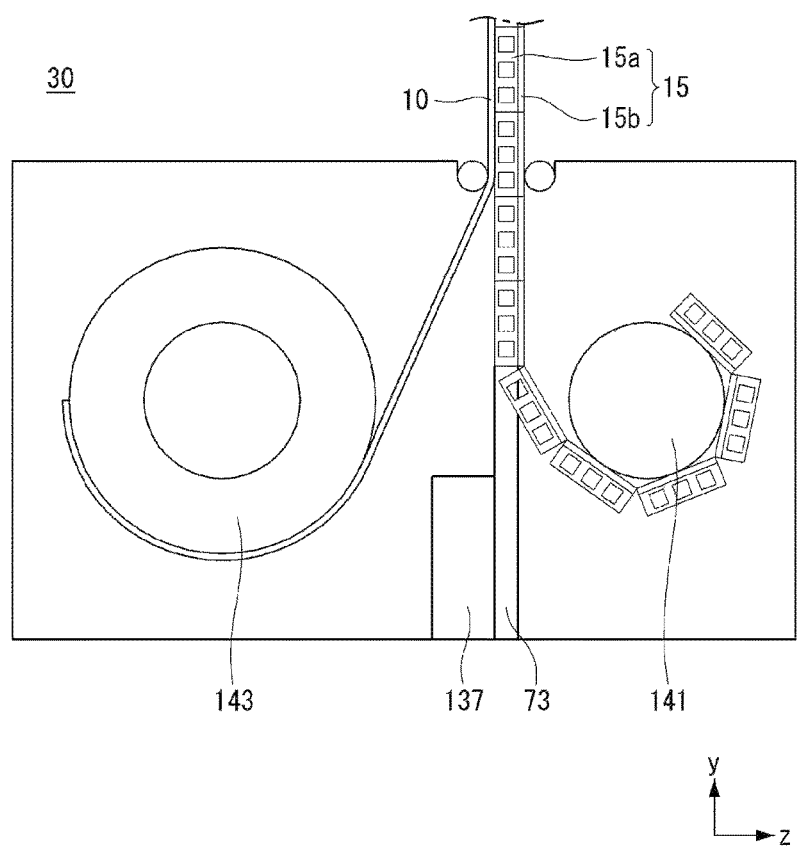

【FIG. 13】
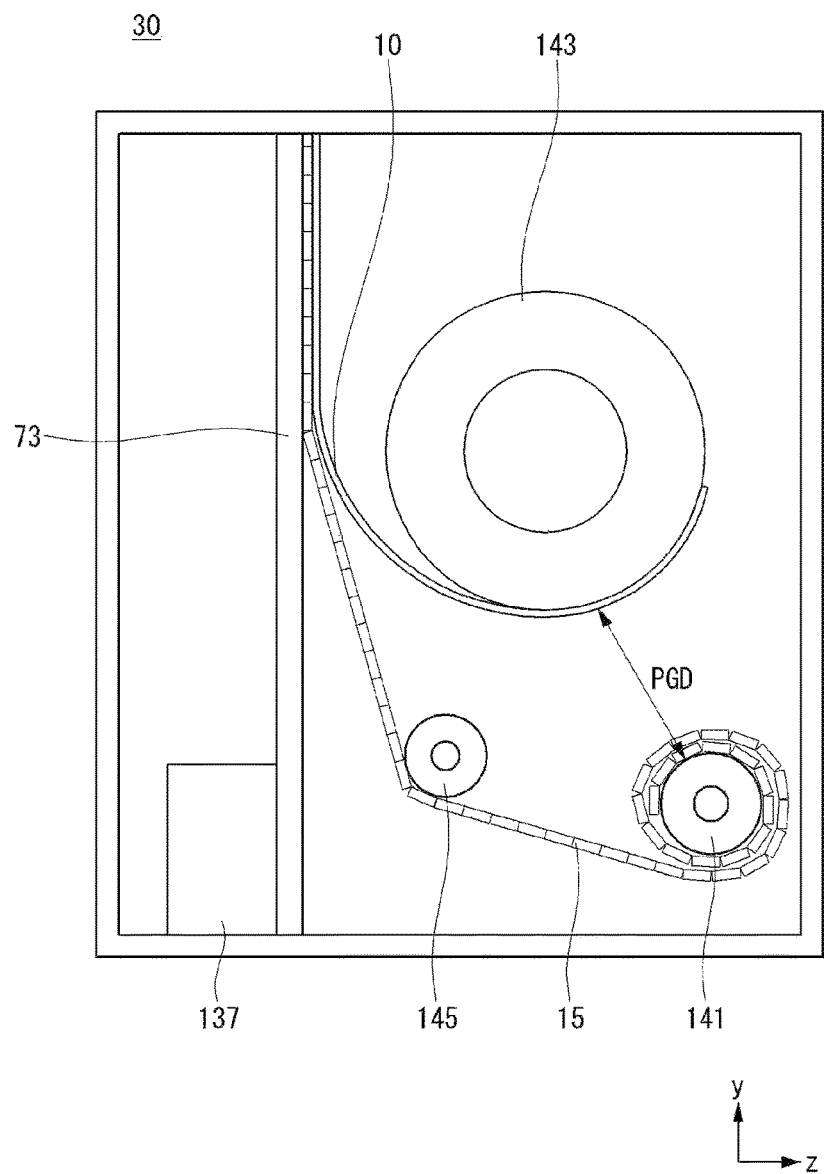

[FIG. 14]
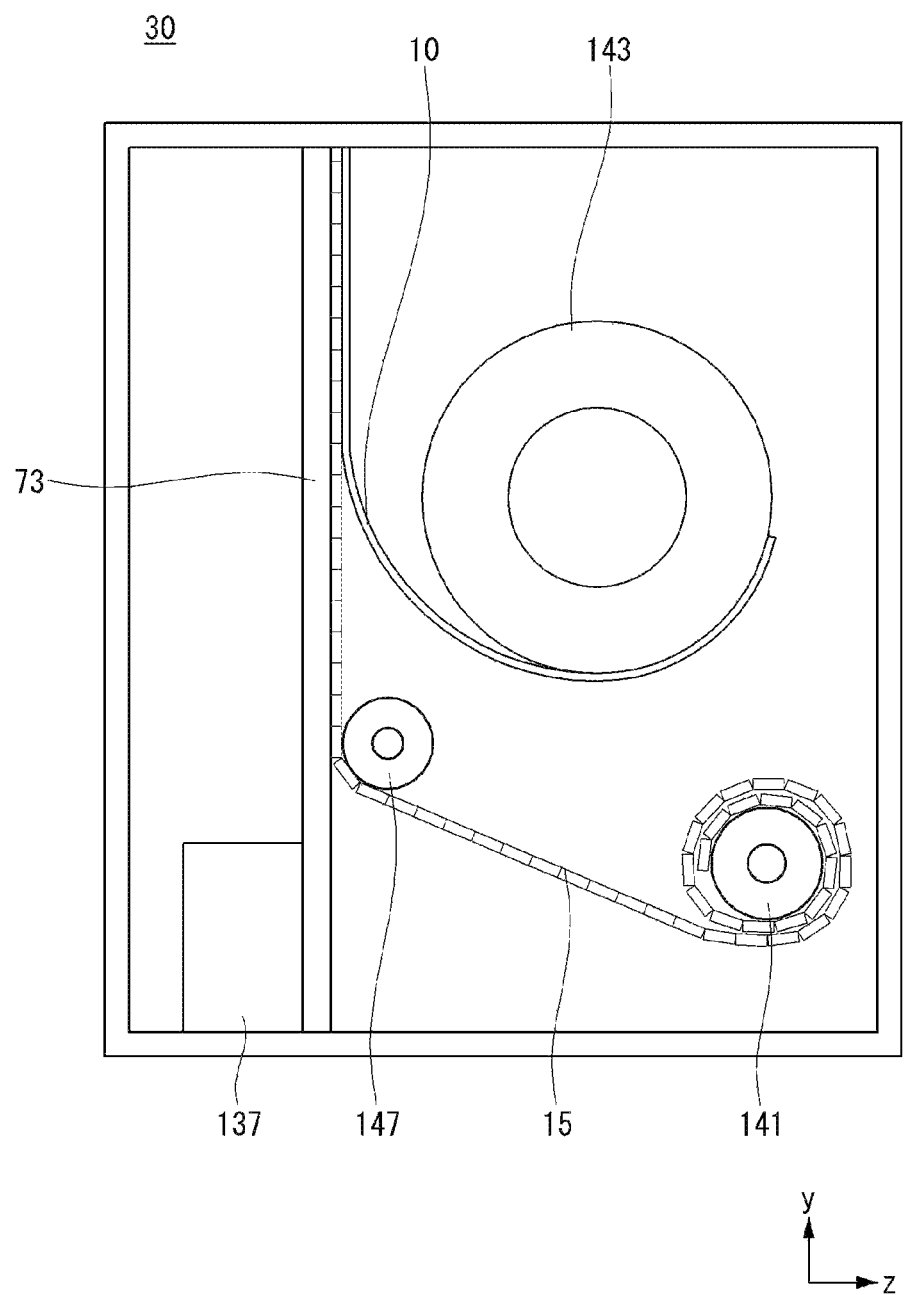

【FIG. 15】
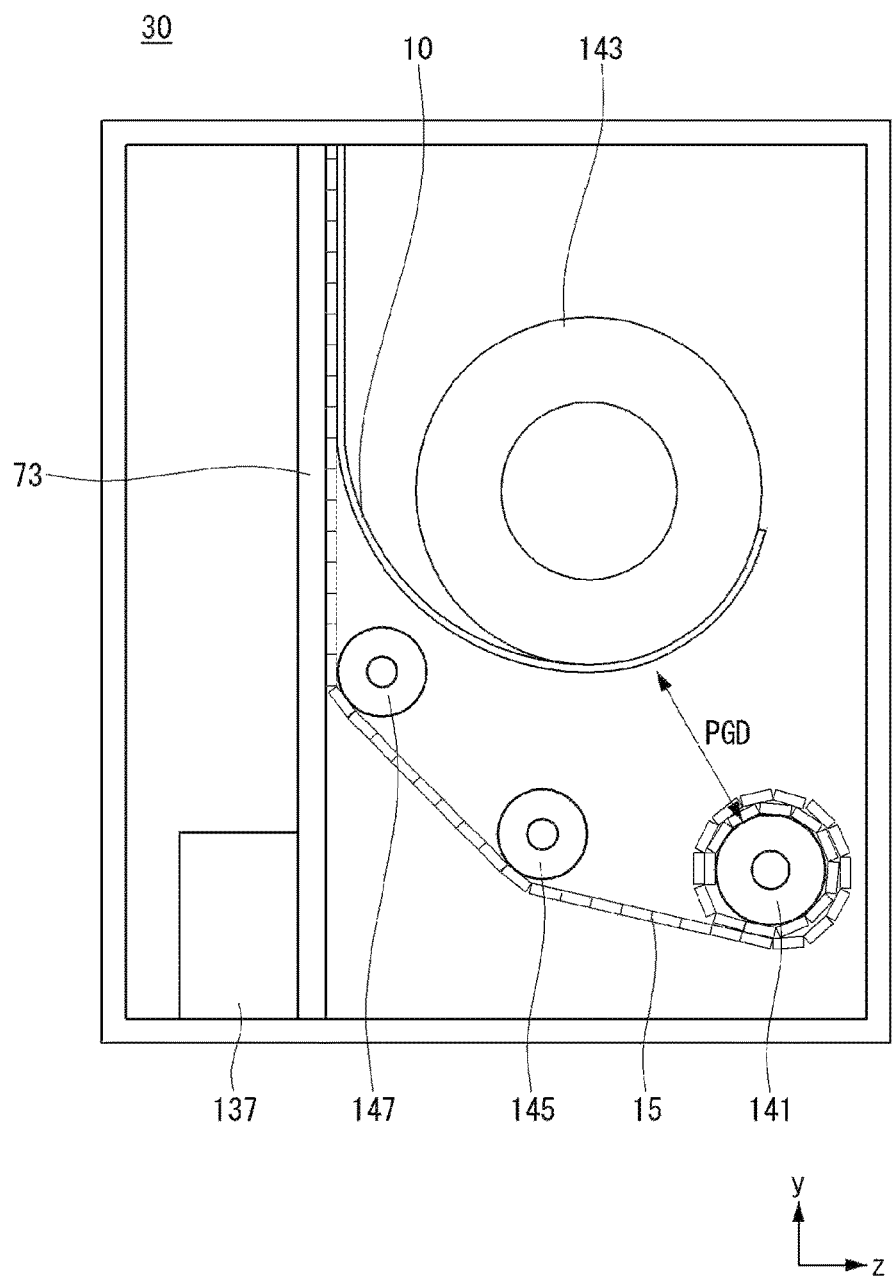

[FIG. 16]
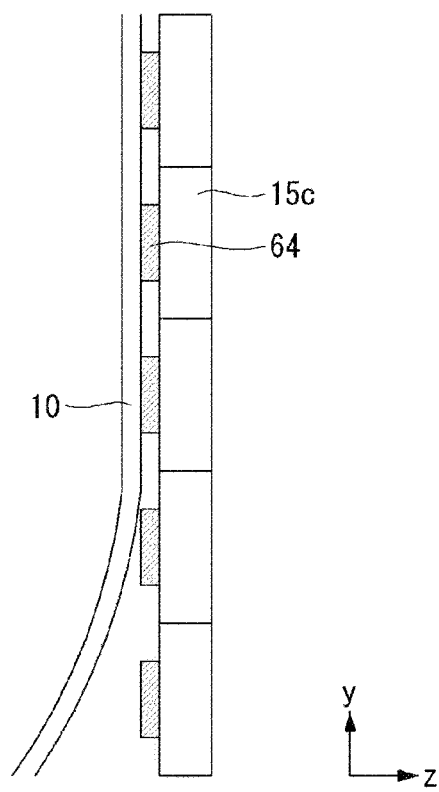

[FIG. 17]
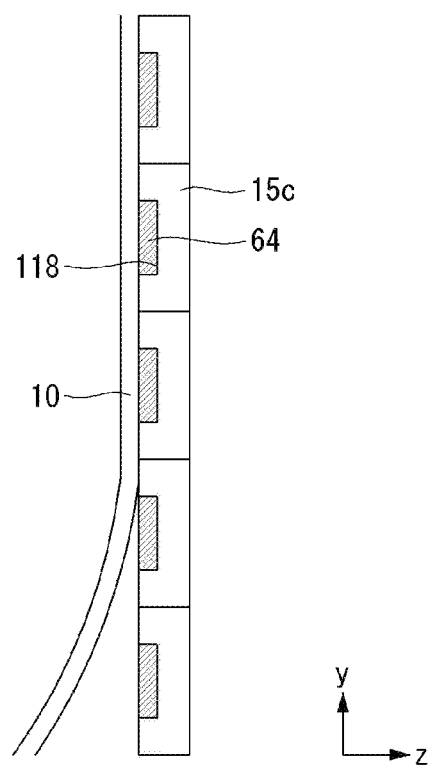

[FIG. 18]
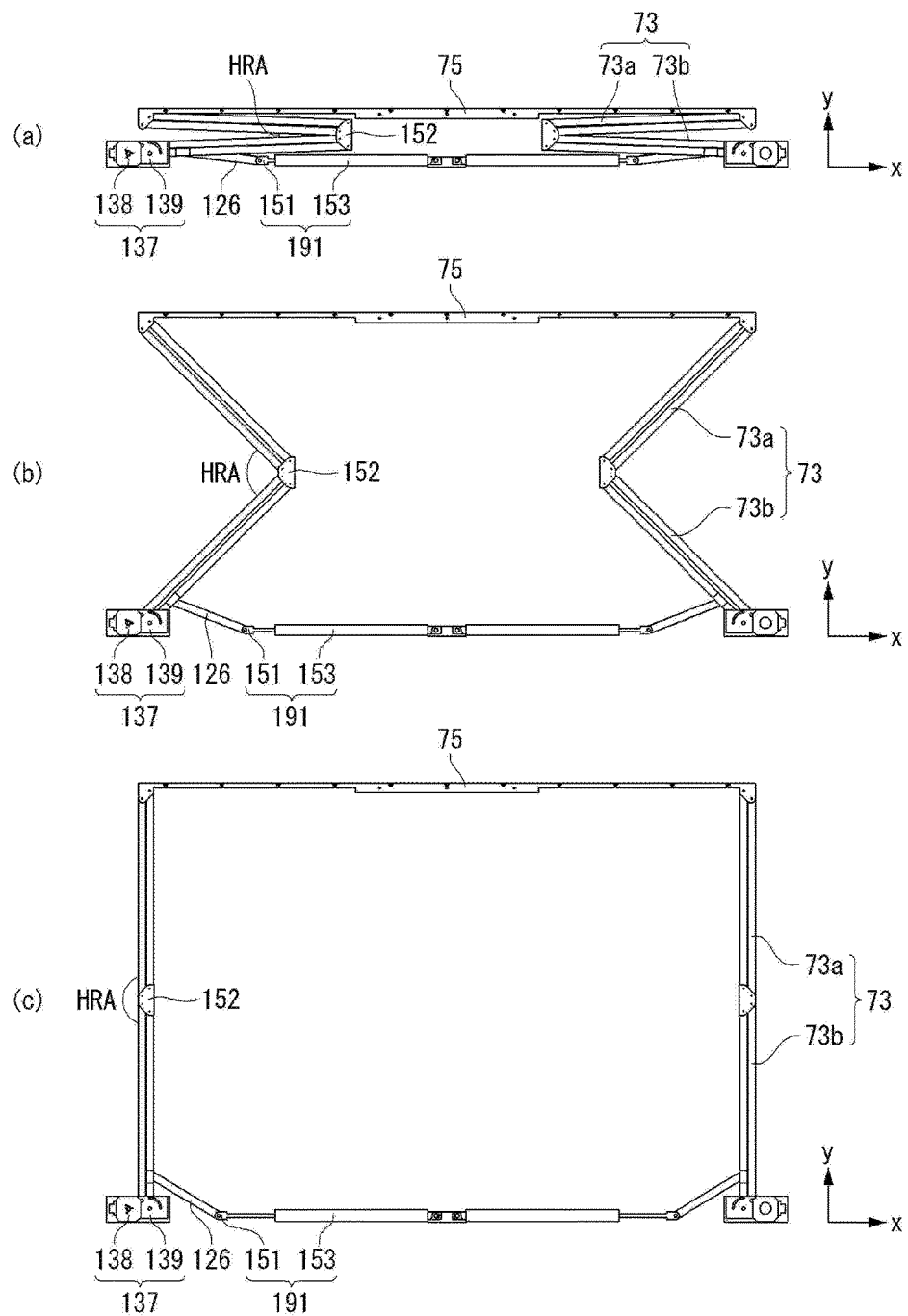

[FIG. 19]
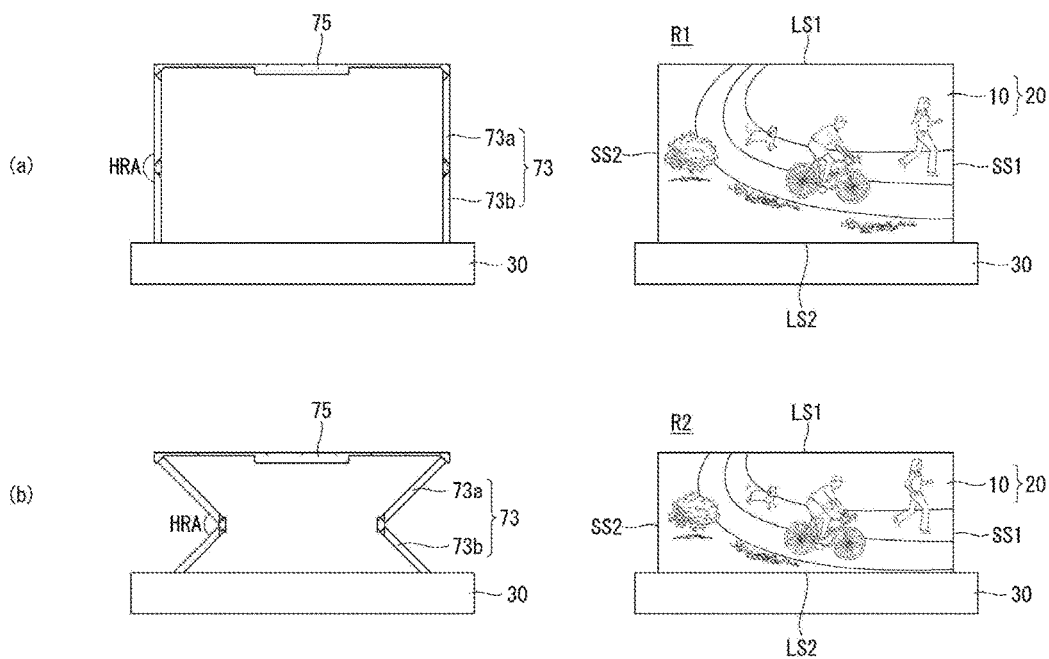

[FIG. 20]
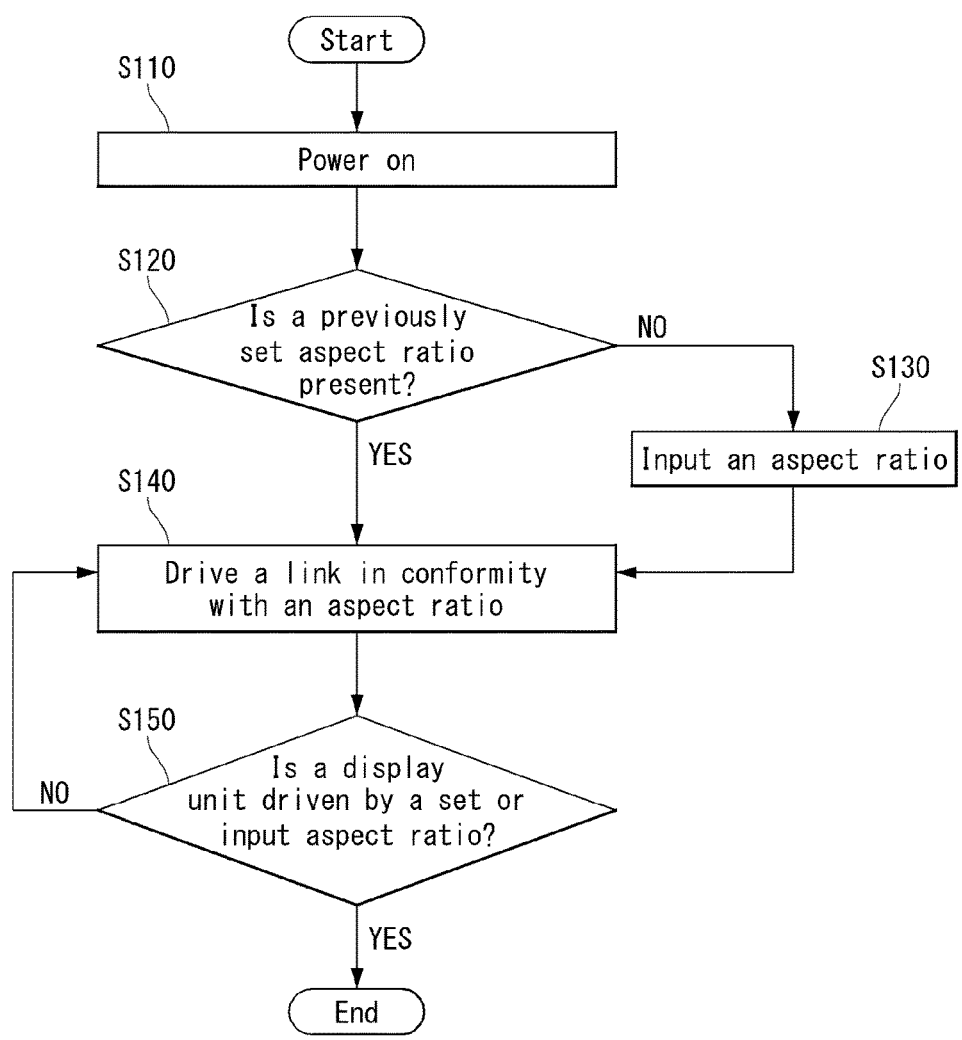

[FIG. 21]
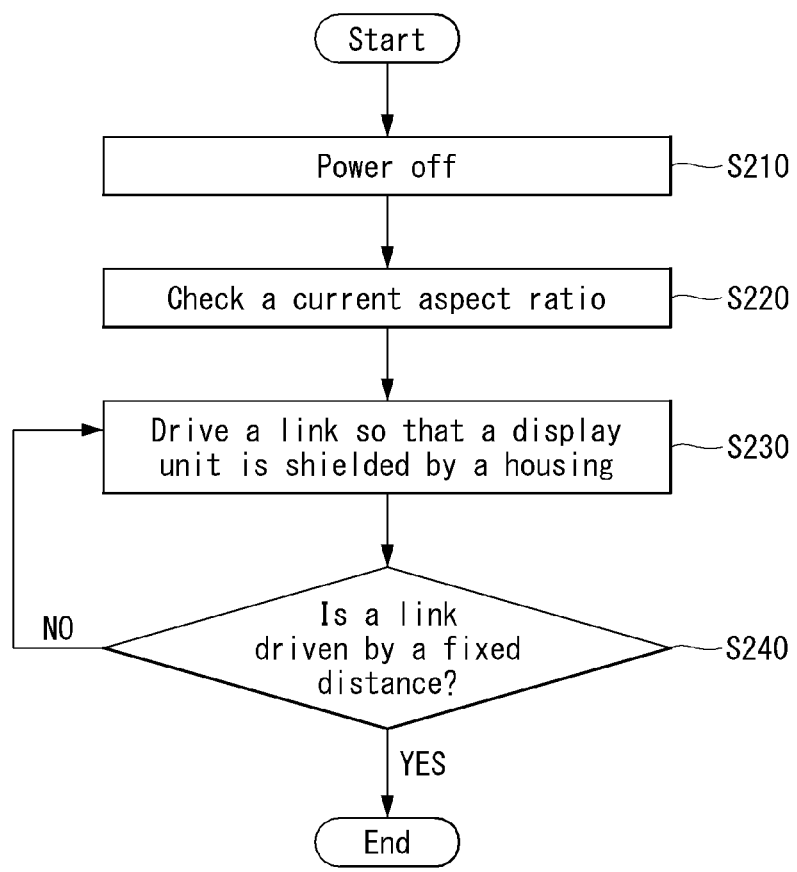

[FIG. 22]
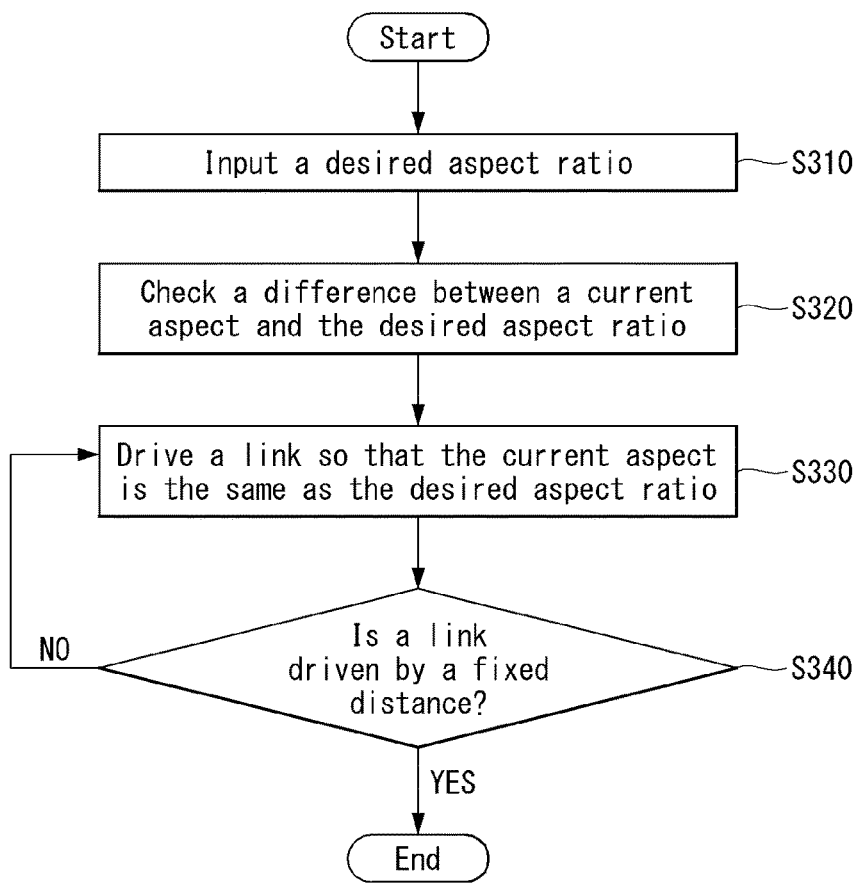

[FIG. 23]
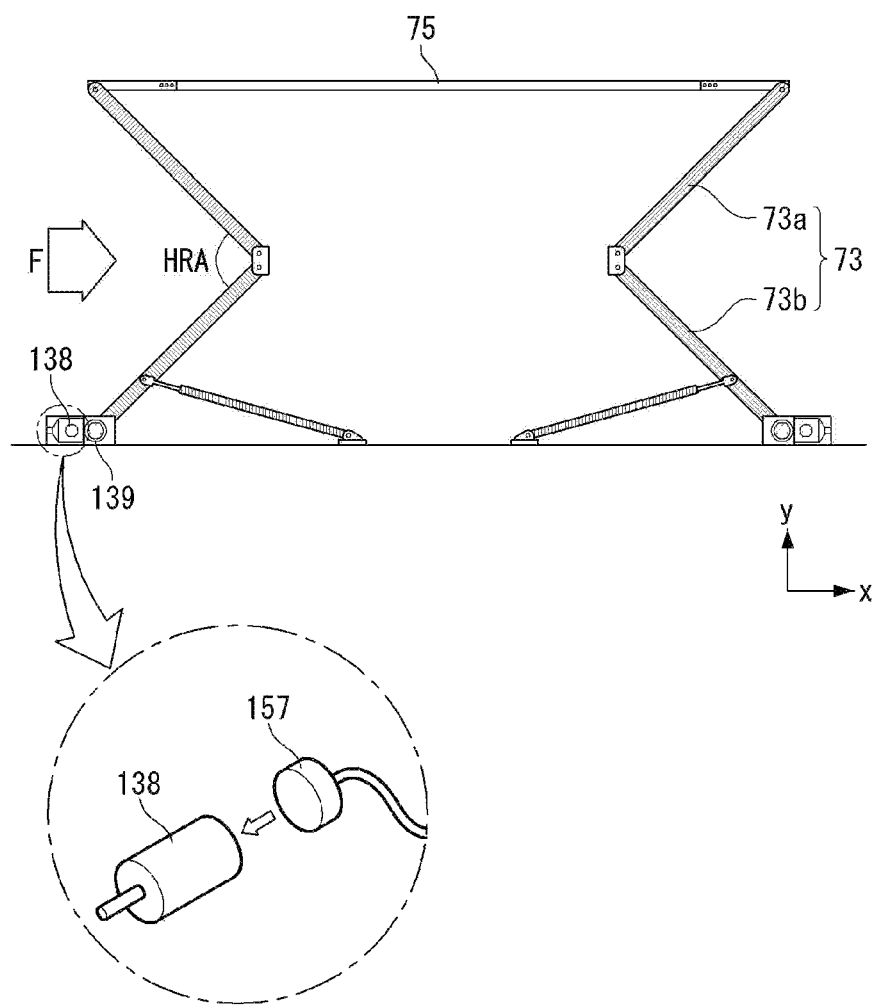

[FIG. 24]
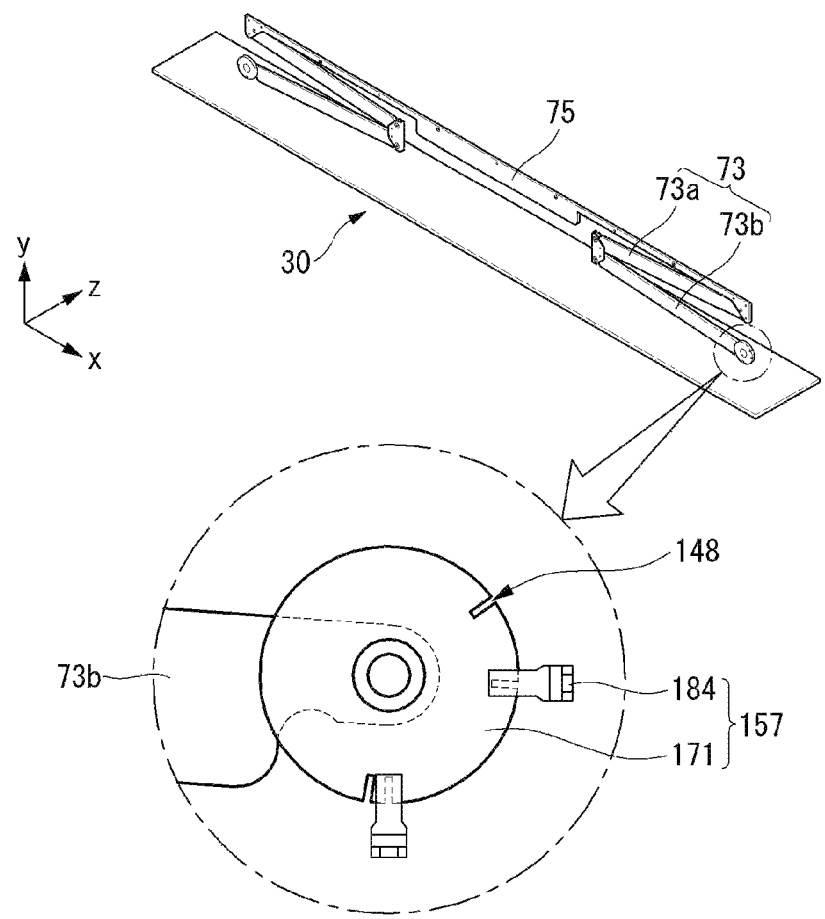

【FIG. 25】
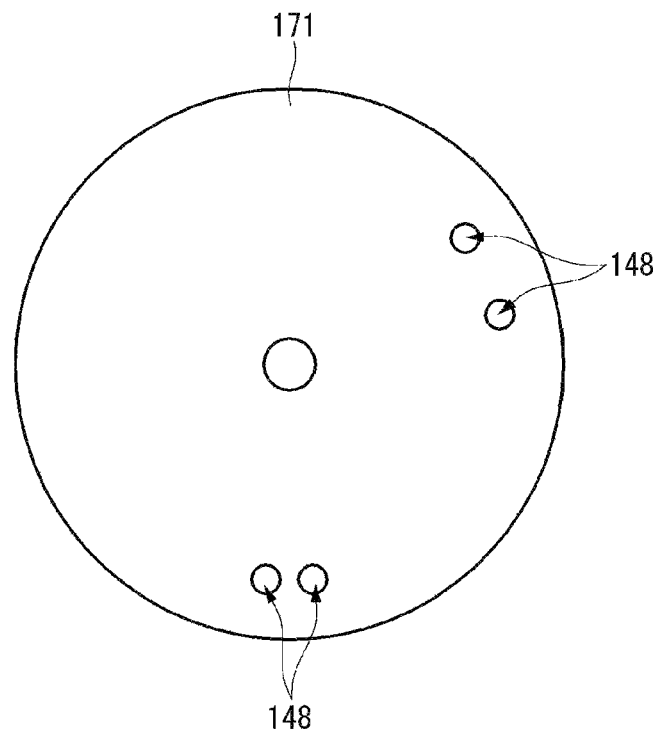
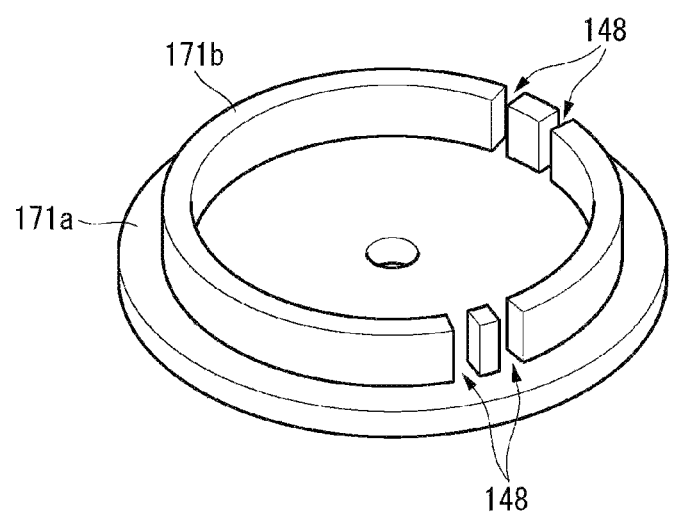

[FIG. 26]
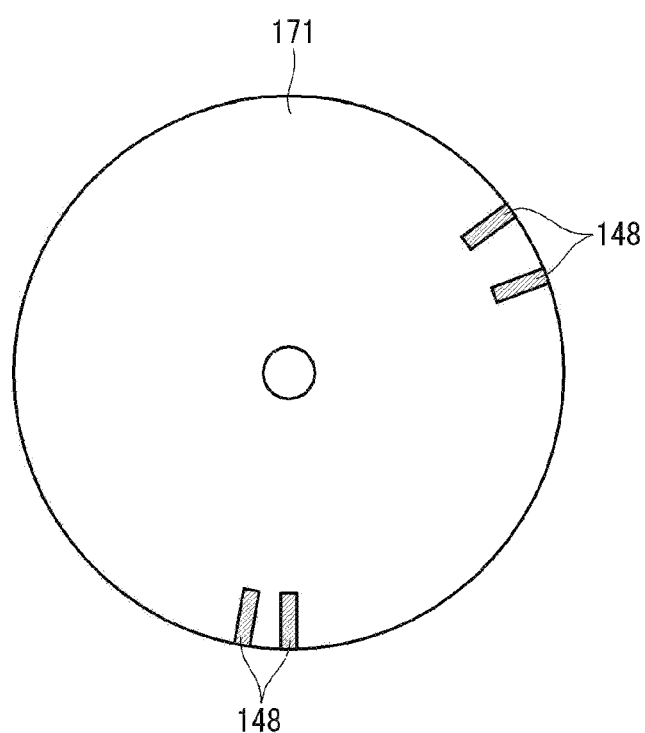

[FIG. 27]
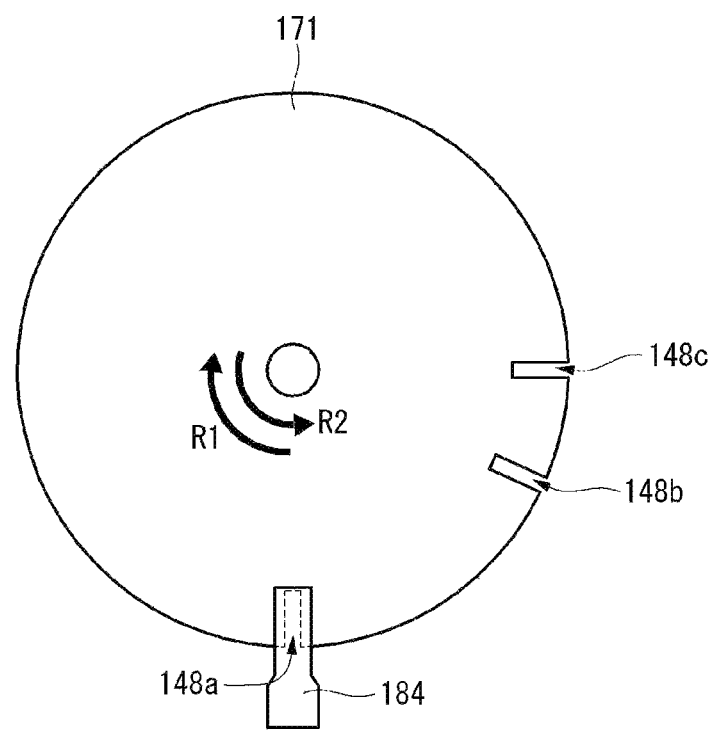

[FIG. 28]
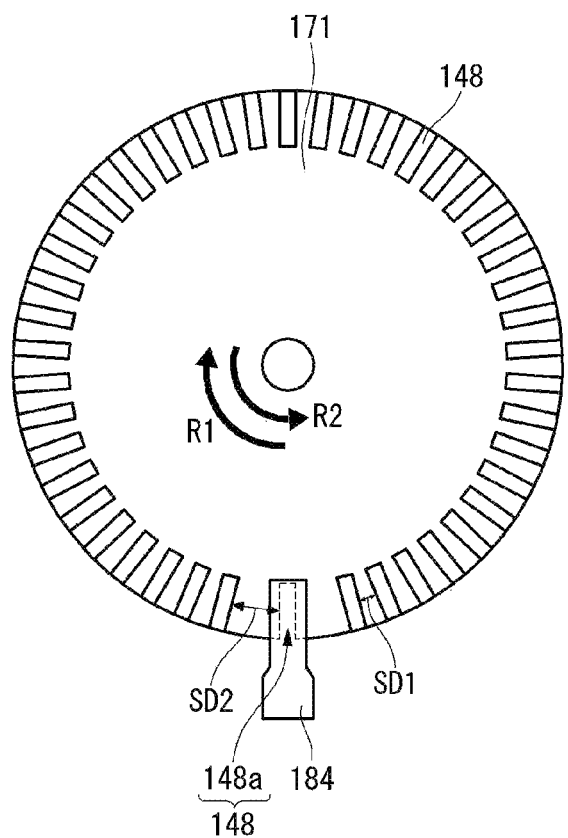

[FIG. 29]
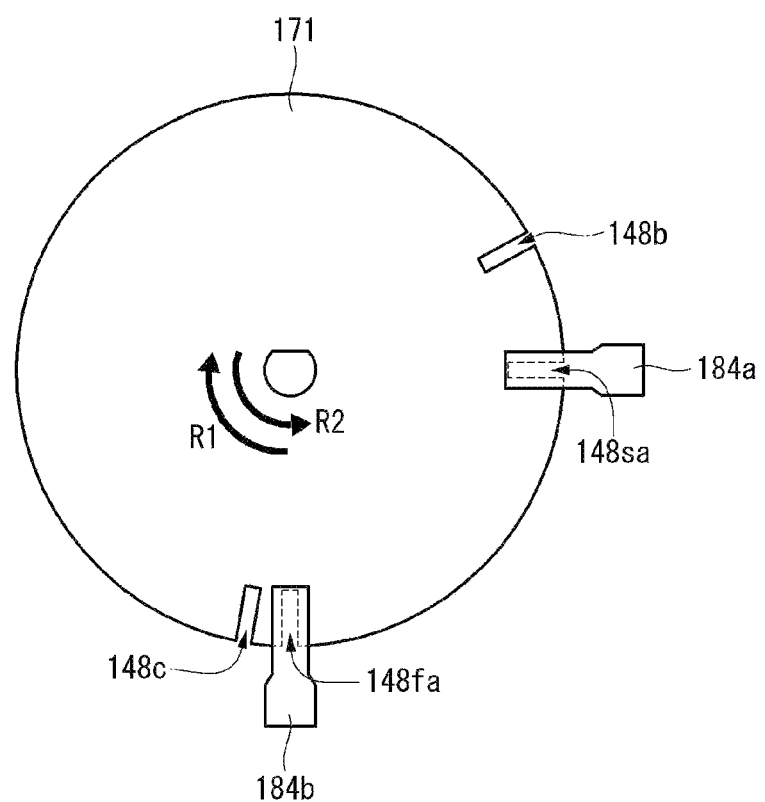

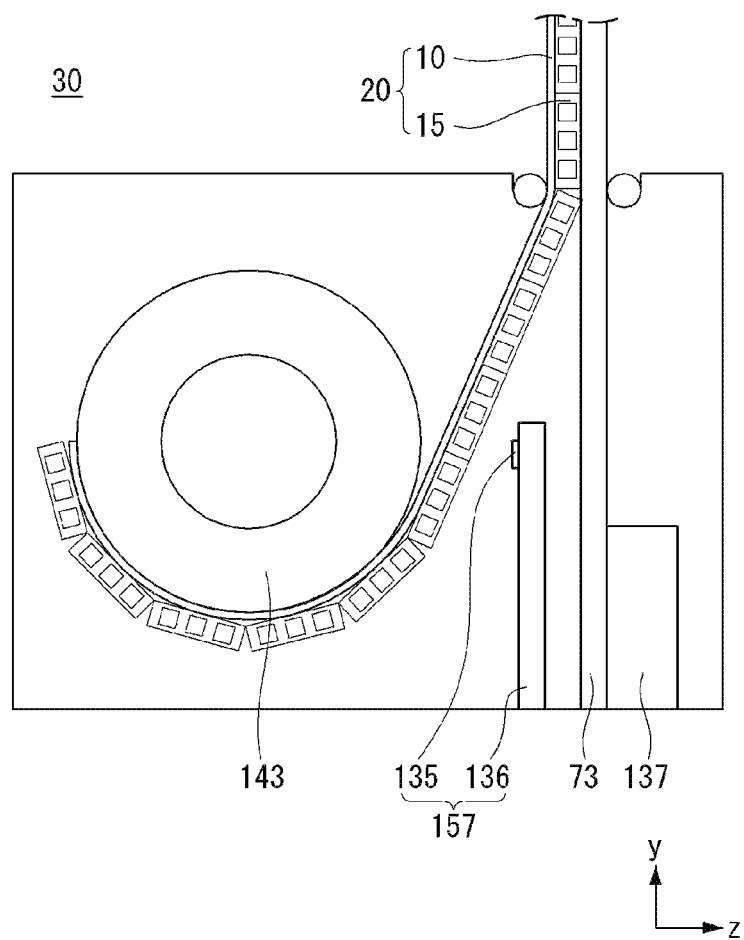
[FIG. 30]

[FIG. 31]
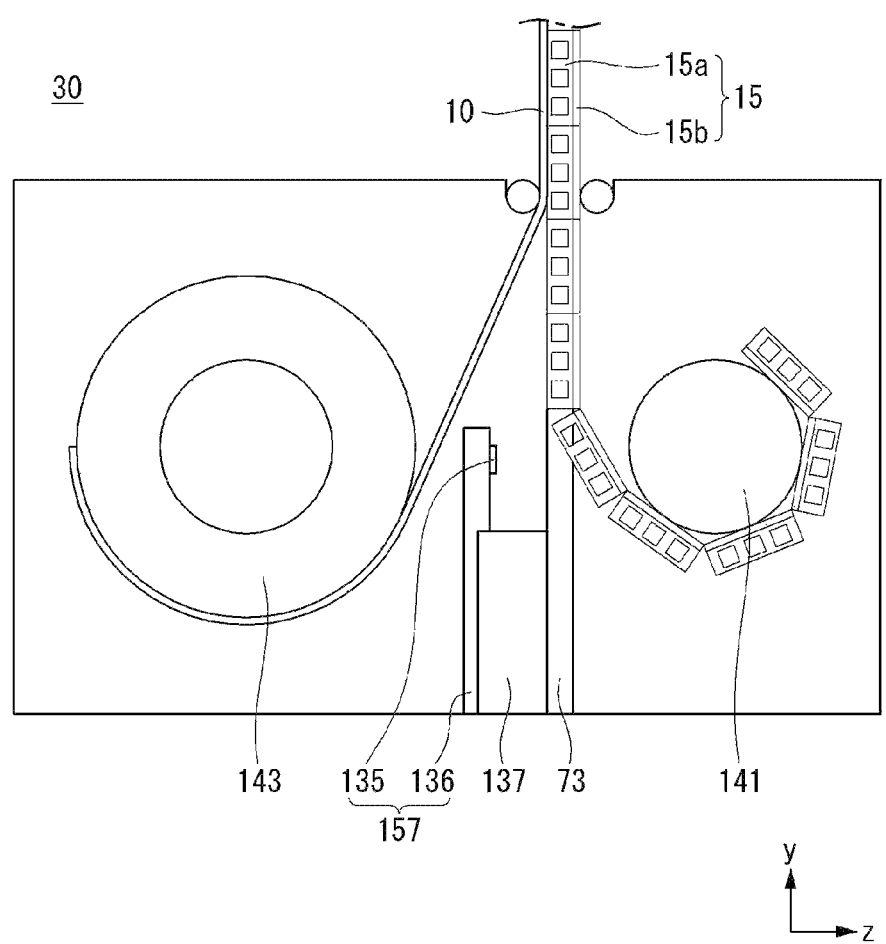

[FIG. 32]
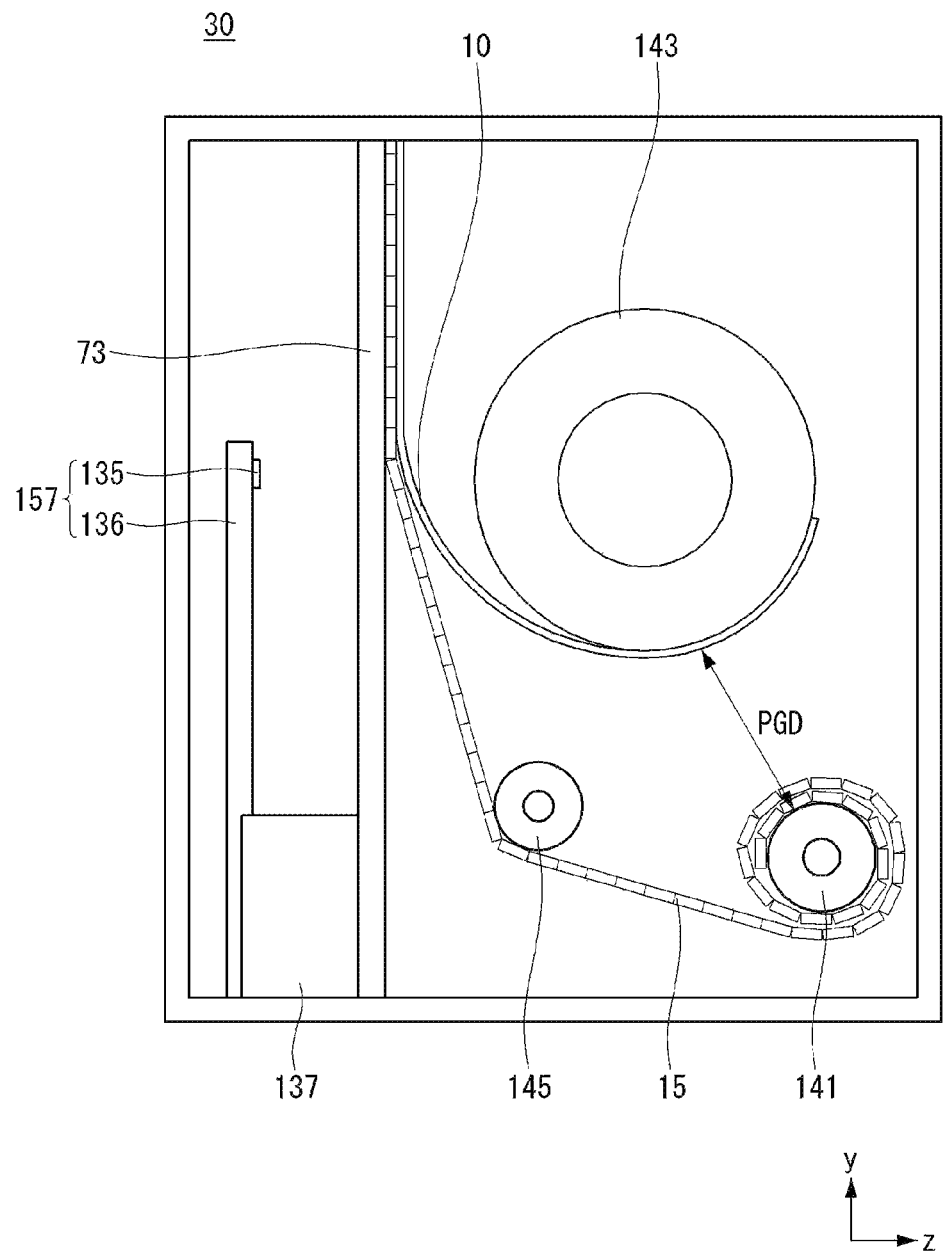

【FIG. 33】
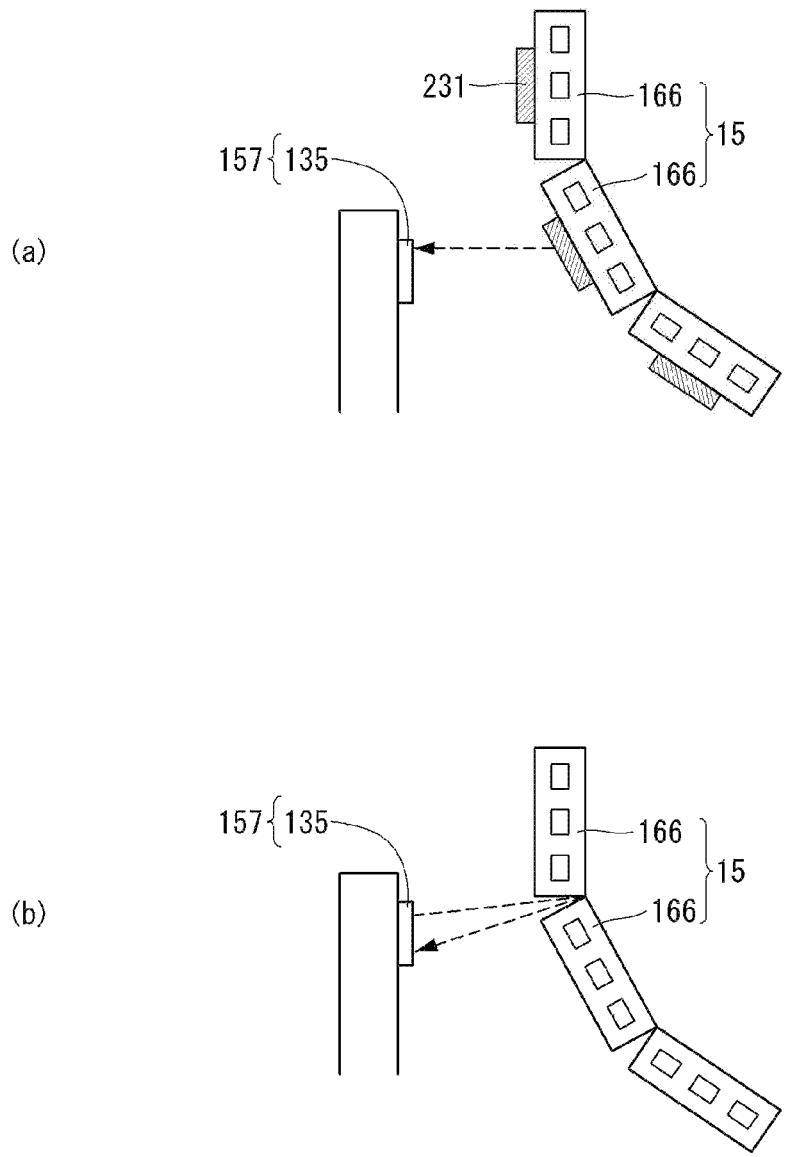

【FIG. 34】
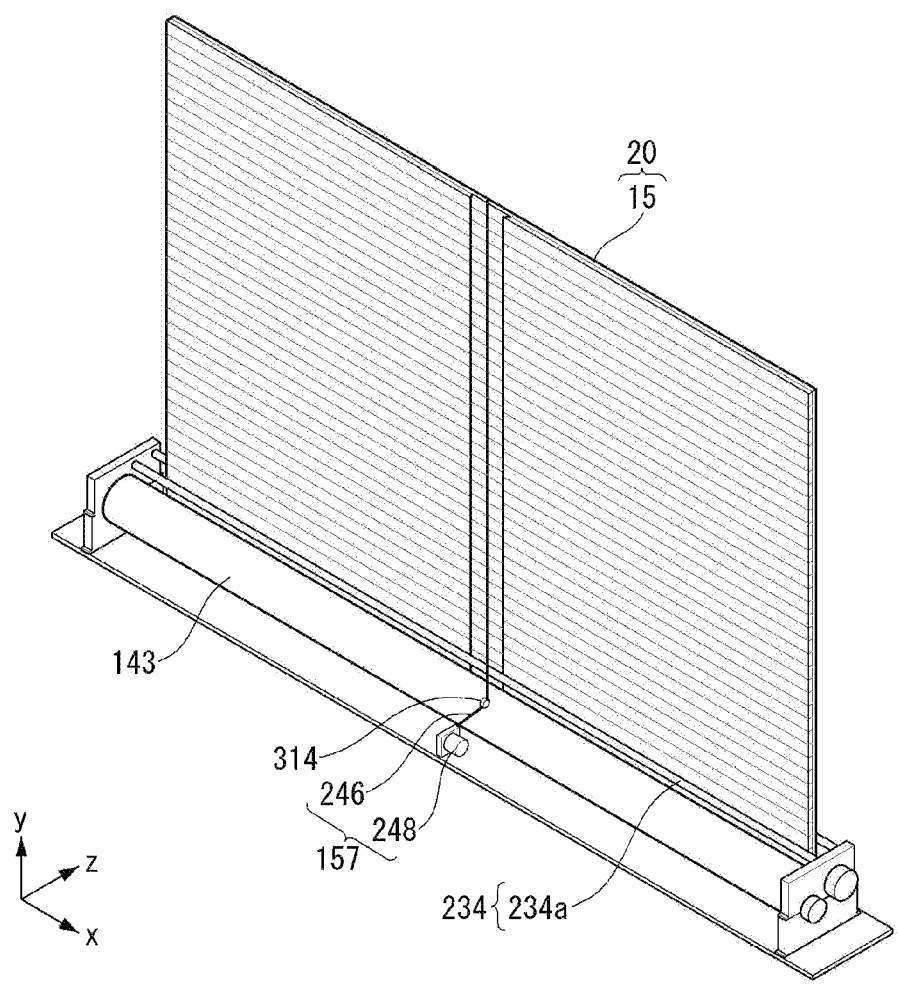

[FIG. 35]
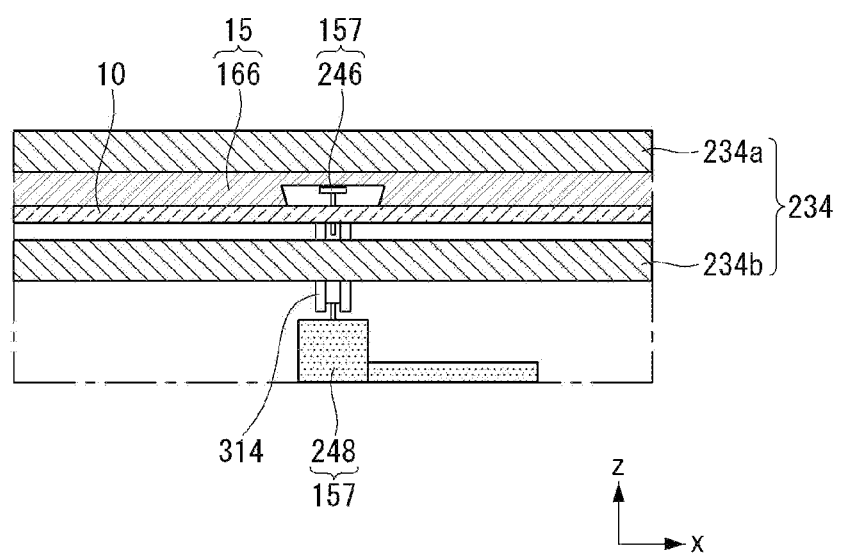

DISPLAY APPARATUS

CROSS-REFERENCE TO RELATED APPLICATIONS

This application is the National Stage filing under 35 U.S.C. 371 of International Application No. PCT/KR2016/002328, filed on Mar. 9, 2016, which claims the benefit of earlier filing date and right of priority to Korean Application No. 10-2016-0017321, filed on Feb. 15, 2016, the contents of which are all hereby incorporated by reference herein in their entirety.

TECHNICAL FIELD

The present disclosure relates to a display apparatus, and more particularly to a display apparatus enabling a controller to easily distinguish a first state from a second state through an encoder including two sensors.

BACKGROUND ART

With the development of the information society, various demands for display devices are increasing. Various display devices, such as liquid crystal displays (LCDs), plasma display panels (PDPs), electroluminescent displays (ELDs), and vacuum fluorescent displays (VFDs), have been recently studied and used in response to the various demands for the display devices.

A display device using an organic light emitting diode (OLED) is advantageous in that it has better luminance characteristic and viewing angle characteristic than a liquid crystal display, and has a ultra-thin profile because it does not require a backlight unit unlike the liquid crystal display.

DISCLOSURE

Technical Problem

An object of the present disclosure is to address the above-described and other problems. Another object of the present disclosure is to provide a display apparatus enabling a controller to easily distinguish a first state from a second state.

Technical Solution

In one aspect of the present disclosure, there is provided a display apparatus comprising a housing, at least one roller positioned inside the housing, a display unit including a display panel and a module cover, a driver including a motor assembly, an upper bar coupled to an upper part of the display unit, and at least one support portion having one side coupled to both ends of the upper bar and another side coupled to the motor assembly, the at least one support portion moving the upper bar up and down, and an encoder positioned inside the housing and spaced from the at least one roller, wherein the display panel and the module cover are in a first state, in which they are wound on the at least one roller, or a second state in which they are unwound from the at least one roller, are in contact with each other, and are exposed to an outside of the housing, wherein the at least one support portion includes an upper link of which one end is coupled to the upper part, a lower link of which one end is coupled to the motor assembly, and a hinge connecting the upper link to the lower link, wherein the encoder is coupled to a rotation axis of one end of the lower link.

The encoder may include an encoder disk coupled to the lower link and a sensor surrounding an outer circumference of the encoder disk.

The encoder disk may include a slit having a bar shape on the outer circumference, and the slit may include a magnetic material.

The encoder disk may include at least one slit that is recessed from the outer circumference to a center of the encoder disk.

The at least one slit may have a bar shape or a circular shape.

The at least one slit may include an origin slit, a first screen slit spaced from the origin slit by a predetermined angle, and a second screen slit spaced from the first screen slit by a predetermined angle.

The sensor may be positioned on the second screen slit at a first aspect ratio and may be positioned on the first screen slit at a second aspect ratio.

In the first aspect ratio, a ratio of a long side to a short side of the display panel may be 16:9. In the second aspect ratio, a ratio of a long side to a short side of the display panel may be 21:9.

The display apparatus further comprises a controller configured to transmit a control signal. When the first state changes to the second state, the controller may transmit a control signal that stops a drive of the driver when the sensor senses the at least one slit.

The sensor may include a main sensor and a sub-sensor spaced from the main sensor by a predetermined angle. The at least one slit may include first and second origin slits spaced from each other by a predetermined angle, a first screen slit spaced from the second origin slit by a predetermined angle, and a second screen slit spaced from the first screen slit by a predetermined angle.

The main sensor and the sub-sensor in the first state may be positioned in portions corresponding to the first and second origin slits.

The at least one sensor may be configured such that only the main sensor in the second state is positioned in a portion corresponding to the at least one slit.

The display apparatus further comprise a controller configured to transmit a control signal. When the first state changes to the second state, the controller may transmit a control signal that stops a drive of the driver when the main sensor senses the at least one slit.

The display apparatus further comprises a controller configured to transmit a control signal. When the second state changes to the first state, the controller may transmit a control signal that stops a drive of the driver when both the main sensor and the sub-sensor sense the slit.

The sensor may be one of an optical sensor and a hall sensor.

In another aspect of the present disclosure, there is provided a display apparatus comprising a housing, at least one roller positioned inside the housing, a display unit including a display panel and a module cover, a driver including a motor assembly, an upper bar coupled to an upper part of the display unit, and at least one support portion having one side coupled to both ends of the upper bar and another side coupled to the motor assembly, the at least one support portion moving the upper bar up and down, and an encoder positioned inside the housing and spaced from a lower side of the at least one roller, wherein the display panel and the module cover are in a first state, in which they are wound on the at least one roller, or a second state in which they are unwound from the at least one roller, are in contact with each other, and are exposed to an outside of the housing, wherein one end of the encoder is connected to the upper bar, wherein the encoder is wound and unwound in conjunction with the display panel and the module cover.

The module cover may include a depression recessed to an inside of a portion corresponding to the encoder in a left-right direction.

The encoder may be inserted into the depression and may be wound and unwound in conjunction with the display panel and the module cover.

The encoder may include a body fixed to an inside of the housing and a wire wound and unwound from the body.

The display apparatus further comprises a controller configured to transmit a control signal. When the wire is unwound from the body by a length corresponding to a set or input aspect ratio, the controller may transmit a control signal that stops a drive of the driver.

Advantageous Effects

An effect of a display apparatus according to the present disclosure is described as follows.

According to at least one aspect of the present disclosure, the present disclosure can allow a controller to easily distinguish a first state from a second state through an encoder including two sensors.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

DESCRIPTION OF DRAWINGS

FIGS. 1 to 18 illustrate configuration of a display apparatus related to the present disclosure.

FIGS. 19 to 35 illustrate a display apparatus according to an embodiment of the disclosure.

MODE FOR INVENTION

Reference will now be made in detail to embodiments of the disclosure, examples of which are illustrated in the accompanying drawings. Wherever possible, the same reference numbers will be used throughout the drawings to refer to the same or like parts. In general, a suffix such as "module" and "unit" may be used to refer to elements or components. Use of such a suffix herein is merely intended to facilitate description of the specification, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Hereinafter, embodiments of the disclosure are described using an organic light emitting diode (OLED) display panel as an example of a display panel. However, embodiments of the disclosure are not limited thereto. For example, a liquid crystal display (LCD) panel, a plasma display panel (PDP), and a field emission display (FED) panel may be used.

FIGS. 1 to 18 illustrate configuration of a display apparatus related to the present disclosure.

As shown in FIG. 1, in the following description, a display panel 10 may include a first long side LS1, a second long side LS2 opposite the first long side LS1, a first short side SS1 adjacent to the first long side LS1 and the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

Embodiments of the disclosure describe that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display panel 10, and a second direction DR2 may be a direction parallel to the short sides SS1 and SS2 of the display panel 10.

A third direction DR3 may be a direction vertical to the first direction DR1 and/or the second direction DR2.

In embodiments disclosed herein, the first direction DR1 and the second direction DR2 may be commonly referred to as a horizontal direction. Further, the third direction DR3 may be referred to as a vertical direction.

In addition, a side or a surface, on which a display apparatus 100 displays an image, may be referred to as a front side or a front surface. When the display apparatus 100 displays the image, a side or a surface, at which the image cannot be observed, may be referred to as a back side or a back surface. When the display apparatus 100 is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display apparatus 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Referring to FIG. 2, the display apparatus 100 according to the embodiment of the disclosure may include a display unit 20 and a housing 30.

The display unit 20 may include the display panel 10 and a module cover 15. The display panel 10 may be provided on a front surface of the display apparatus 100 and may display an image. The display panel 10 may divide an image into a plurality of pixels and output the image by controlling the light emission in accordance with color, brightness, and chroma of each pixel. The display panel 10 may be divided into an active area, in which an image is displayed, and an inactive area, in which no image is displayed.

The display panel 10 may have a rectangular shape. However, embodiments of the disclosure are not limited thereto. For example, the display panel 10 may have a shape in which an edge has a predetermined curvature. The display panel 10 may be an OLED display panel. Other display panels may be used. For example, a liquid crystal display panel may be used.

The module cover 15 may be provided on a back surface of the display panel 10. The module cover 15 may be directly attached to the display panel 10. A size of the module cover 15 may be equal to or greater than a size of the display panel 10.

The module cover 15 may support the back surface of the display panel 10. Hence, the module cover 15 may include a lightweight material with high rigidity. For example, the module cover 15 may include aluminum.

The housing 30 may be provided on a back surface of the display unit 20. Namely, the housing 30 may be provided on a back surface of the module cover 15. The housing 30 may shield at least one printed circuit board (PCB). Namely, the housing 30 may cover at least one PCB attached to the back surface of the module cover 15. A detailed coupling structure and a coupling method of at least one PCB are described below.

The housing 30 may receive electromagnetic waves emitted from at least one PCB. Hence, although not shown, the housing 30 may include an inner housing made of a conductive material and an outer housing covering the inner housing. However, embodiments of the disclosure are not limited thereto. For example, the housing 30 may be configured as one body made of a conductive material.

Referring to FIG. 3, in the display apparatus 100 according to the embodiment of the disclosure, the housing 30 may be positioned under the display unit 20. More specifically, the housing 30 may have a shape surrounding a lower part of the display unit 20. Namely, the housing 30 may be configured not to expose various driving devices or driving circuits positioned inside the housing 30 to the outside.

A width of the housing 30 in the first and third directions may be greater than a width of the display unit 20 in the first and third directions in order to protect the display unit 20 therein. A width of the housing 30 in the second direction may be less than a width of the display unit 20 in the second direction because the housing 30 interferes with the view of a user.

The housing 30 may not be positioned in the active area of the display unit 20. Hence, the users can be immersed in the screen of the thinner display unit 20.

Referring to FIG. 4, the display apparatus 100 according to the embodiment of the disclosure may be in a first state, in which the active area of the display unit 20 is positioned inside the housing 30, or a second state in which the active area of the display unit 20 is exposed to the outside of the housing 30.

When the display apparatus 100 is in the first state, the active area of the display unit 20 may be positioned inside the housing 30. Namely, the display unit 20 may be shielded by the housing 30 in the first state.

When the display apparatus 100 is in the second state, the active area of the display unit 20 may be exposed to the outside of the housing 30. Namely, at least a portion of the display unit 20 may protrude to an upper part of the housing 30 in the second state.

Although not shown, the display unit 20 may change from the first state to the second state by a roller positioned inside the housing 30. More specifically, the display unit 20 may change from the first state, in which the display unit 20 is wound by the roller, to the second state in which the display unit 20 is unwound by the roller and is exposed to the outside. On the contrary, the display unit 20 may change from the second state to the first state when the display unit 20 is wound by the roller. A structure and an operation method of the roller and the display unit 20 are described in detail below.

The display unit 20 of the display apparatus 100 according to the embodiment of the disclosure may be in the first state or the second state. Thus, the user can expose the display unit 20 to the outside of the housing 30 only when viewing the display apparatus 100, thereby saving space.

Referring to FIG. 5, a panel roller 143 may be connected to one end of the display panel 10. The panel roller 143 may wind or unwind the display panel 10 so that the display panel 10 is in the first state or the second state.

In the display apparatus according to embodiments of the disclosure, at least one source PCB 120 may be positioned on at least a portion of a front surface of the display panel 10. For example, a plurality of source PCBs 120 may be positioned to be spaced from one another.

Signal lines may be positioned on at least one source PCB 120 and may transmit digital video data and timing control signals received from a timing controller board 105. The source PCB 120 may be connected to the display panel 10 by a source chip-on film (COF) 123. The source COF 123 connected to one side of the source PCB 120 may be extended to the active area of the display panel 10 and connected to the display panel 10.

A seating portion 379 may be positioned on an outer circumference of the panel roller 143. Namely, at least a portion of the outer circumference of the panel roller 143 may be stepped. The seating portion 379 may be positioned at a contact portion between the source PCB 120 and the panel roller 143 when the panel roller 143 is wound or unwound. The seating portion 379 may have a shape in which at least a portion of the outer circumference of the panel roller 143 is recessed.

When the panel roller 143 is wound, the source PCB 120 may be placed in the seating portion 379, and at least a portion of the source PCB 120 may contact the panel roller 143. Hence, even when the panel roller 143 is wound, the source PCB 120 may not be damaged.

The timing controller board 105 may be mounted inside the panel roller 143. A flexible flat cable (FFC) 117 connected to the source PCB 120 can be prevented from being twisted by mounting the timing controller board 105 inside the panel roller 143.

The panel roller 143 may include an upper panel roller 331 and a lower panel roller 337. The upper panel roller 331 and the lower panel roller 337 may be coupled to each other by at least one screw. The timing controller board 105 may be mounted between the upper panel roller 331 and the lower panel roller 337. At least one screw may couple the upper panel roller 331 to the lower panel roller 337 and also couple them to the timing controller board 105. The FFC 117 may be connected to the timing controller board 105 and the source PCB 120 through a hole positioned in the upper panel roller 331.

Because the timing controller board 105 rotates together with the panel roller 143, the FFC 117 may be coupled to the timing controller board 105 and the source PCB 120 without being twisted. Further, space can be saved because the timing controller board 105 is mounted inside the panel roller 143.

Referring to FIG. 6, the timing controller board 105 may be mounted inside the panel roller 143 at one side of the housing 30 with respect to the center of the housing 30 in which the display panel moves up and down, and a power supply board 107 and a main board 109 may be positioned at the other side of the housing 30.

The timing controller board 105 may be connected to the power supply board 107 and the main board 109. The timing controller board 105 may be connected to the power supply board 107 and the main board 109 through a wiring electrode 113. More specifically, the wiring electrode 113 may include a first wiring electrode 307 connecting the timing controller board 105 to the power supply board 107 and a second wiring electrode 309 connecting the timing controller board 105 to the main board 109.

For example, a plurality of first wiring electrodes 307 may be disposed. The first wiring electrode 307 may be in a circular shape. The first wiring electrode 307 may connect the timing controller board 105 to the power supply 107 through an opening in the center of a rotation axis of the panel roller 143.

The second wiring electrode 309 may use the FFC 117 connected to the timing controller board 105 and the source PCB 120. The second wiring electrode 309 may connect the timing controller board 105 to the main board 109 through an opening in the center of the rotation axis of the panel roller 143.

The first wiring electrode 307 and the second wiring electrode 309 may be positioned on the opposite sides of the timing controller board 105. The openings of the first wiring electrode 307 and the second wiring electrode 309 may be positioned on the opposite sides of the timing controller board 105.

In the display apparatus according to embodiments of the disclosure, the timing controller board 105 may be mounted on the panel roller 143, and the power supply board 107 and the main board 109 may be positioned on the opposite side of the display panel. Hence, an inner space of the housing 30 can be considerably saved.

Referring to FIG. 7, the display apparatus according to the embodiment of the disclosure may include the panel roller 143, a motor assembly 137, and a support portion 73 inside the housing 30.

The panel roller 143 may be positioned in front of a portion of the housing 30 in which the display unit 20 moves up and down. The panel roller 143 may simultaneously wind and unwind the display panel 10 and the module cover 15. Because the module cover 15 is thick, a diameter of the panel roller 143 may greatly increase when the display unit 20 changes from the second state to the first state. Thus, the panel roller 143 may be spaced from each face of the housing 30 by a predetermined distance or more.

The support portion 73 may be positioned at a portion in which the display unit 20 moves up and down. The support portion 73 may function to support the display panel 10 and the module cover 15 so that they can move up and down. More specifically, the support portion 73 may move an upper bar (not shown) coupled to the upper parts of the module cover 15 and the display panel 10 up and down. A driving method of the support portion 73 is described in detail below.

Because only the upper parts of the module cover 15 and the display panel 10 are connected to the upper bar, other parts may easily bend. Thus, the support portion 73 may support the module cover 15 so that the module cover 15 does not bend at the back surface of the module cover 15. Because the support portion 73 continues to move when the display unit 20 changes from the first state to the second state, the support portion 73 may not be coupled to the module cover 15, but may support the module cover 15.

The motor assembly 137 may be positioned at a portion to which the support portion 73 is connected. The motor assembly 137 may drive the support portion 73 so that the support portion 73 moves up or down. The motor assembly 137 may receive an electrical signal and may convert the electrical signal into a physical force. The motor assembly 137 may transfer rotational energy to the support portion 73 and change the display unit 20 from the first state to the second state. A structure and a driving principle of the motor assembly 137 are described in detail below.

The display apparatus according to the embodiment of the disclosure can simultaneously wind and unwind the display panel 10 and the module cover 15 using one roller. Hence, the user can enjoy the screen better by a reduction in a thickness of the housing 30.

Referring to FIG. 8, the module cover 15 may include a plurality of aprons. The apron may have a rectangular shape. The aprons may be spaced from one another and attached to the back surface of the display panel 10. Because the module cover 15 includes the plurality of aprons, a shape of the module cover 15 may be easily changed when the module cover 15 is wound or unwound by the roller. The module cover 15 may include a plastic material or an aluminum material. Hence, the module cover 15 may protect the display panel 10 from an external impact.

The display panel 10 and the module cover 15 may be coupled to each other through adhesive layers 70. The adhesive layer 70 may be a double-sided tape. The display panel 10 and the module cover 15 may be wound or unwound together by the adhesive layers 70. The adhesive layer 70 may be positioned on each apron and attached to the display panel 10. The adhesive layers 70 may be spaced from one another. Hence, the shape of the module cover 15 may be easily changed when the module cover 15 is wound or unwound by the roller. As a width of the adhesive layer 70 in the second direction decreases, the deformation of the display panel 10 against an external force may decrease. More specifically, as the width of the adhesive layer 70 in the second direction decreases, the external force transferred to the display panel 10 may decrease because the flexibility of the display panel 10 is improved.

As a width of the apron in the second direction increases, a crack may not be formed on the display panel 10. More specifically, as the width of the apron in the second direction increases, the crack may not be formed on the display panel 10 because rigidity of the display panel 10 is improved.

Hence, when the width of the adhesive layer 70 in the second direction is equal to or less than 30% of the width of the apron in the second direction, the display screen may be less uneven because the external force transferred to the display panel 10 decreases.

Further, when the width of the adhesive layer 70 in the second direction is equal to or greater than 15% of the width of the apron in the second direction, the display panel 10 may have less cracks because the rigidity of the display panel 10 is improved.

As a width of the adhesive layer 70 in the third direction increases, the deformation of the display panel 10 against an external force may decrease. More specifically, as the width of the adhesive layer 70 in the third direction increases, the external force transferred to the display panel 10 may decrease because the flexibility of the display panel 10 is improved.

Further, as a width of the apron in the third direction decreases, a crack may not be formed on the display panel 10. More specifically, as the width of the apron in the third direction decreases, the crack may not be formed on the display panel 10 because the rigidity of the display panel 10 is improved.

Hence, when the width of the adhesive layer 70 in the third direction is equal to or greater than 3% of the width of the apron in the third direction, the display screen may be less uneven because the external force transferred to the display panel 10 decreases.

Further, when the width of the adhesive layer 70 in the third direction is equal to or less than 6% of the width of the apron in the third direction, the display panel 10 may have less cracks because the rigidity of the display panel 10 is improved.

In the display apparatus according to embodiments of the disclosure, the module cover 15 may include the plurality of aprons, and the adhesive layer 70 may be positioned on each apron. Hence, when the module cover 15 is wound on the roller, the shape of the module cover 15 having the above-described configuration may be more easily changed than when the module cover 15 is configured as one body.

Referring to FIG. 9, in a display apparatus according to another embodiment of the disclosure, each apron may be in a parallelogram shape. Namely, the apron may have a quadrangle shape in which it is inclined in one direction. Because the apron has the parallelogram shape, the display panel may not bend in the opposite direction of a winding/unwinding direction. Hence, the display panel can be kept flat in the second state.

When an external force is applied to the aprons in an opposite direction 315 of the winding/unwinding direction, the aprons may not rotate any longer because the faces of the aprons contact each other. Hence, the display panel can be kept flat.

On the contrary, when an external force is applied to the aprons in a winding/unwinding direction 353, the aprons may freely rotate because the faces of the aprons do not contact each other. Hence, the display panel can be easily wound and unwound.

In a display apparatus according to an embodiment of the disclosure, the apron can rotate in only one direction. Hence, the display panel may not bend even if the external force is applied to it.

Referring to FIG. 10, the module cover 15 and the display panel 10 may be fastened to an upper bar 75. More specifically, the module cover 15 and the display panel 10 may be fastened to the upper bar 75 by at least one screw 115.

When the upper bar 75 moves up and down, at least one screw 115 can prevent the module cover 15 and the display panel 10 from being detached from the upper bar 75 and allow the module cover 15 and the display panel 10 to move up and down together with the upper bar 75. At least one screw 115 may fasten the upper bar 75 to the module cover 15, and at least one screw 115 may fasten the upper bar 75 to the display panel 10. However, embodiments of the disclosure are not limited thereto. For example, at least one screw 115 may fasten the upper bar 75 to the module cover 15 and the display panel 10 together.

In order to couple the module cover 15 to the upper bar 75, an upper module cover 15t may have a different shape from other portions of the module cover 15. The upper module cover 15t may be an uppermost apron positioned at the top. More specifically, the uppermost apron may have a different shape from that of other aprons. A thickness of at least a portion of the upper module cover 15t in the third direction may be different from that of another portion of the upper module cover 15t in the third direction. The at least a portion of the upper module cover 15t having a different thickness may be inserted into a groove of the upper bar 75.

The at least a portion of the upper module cover 15t having the different thickness may be fastened to the upper bar 75 through at least one screw 115. Because the upper module cover 15t is inserted into the upper bar 75, the module cover 15 can be more strongly fastened to the upper bar 75.

As shown in (b) of FIG. 10, a top case 167 may cover the upper bar 75, the module cover 15, and the display panel 10. The top case 167 may shield an upper part and both sides of each of the upper bar 75, the module cover 15, and the display panel 10. At least one screw 115 may fasten the top case 167 to the upper bar 75, the module cover 15, and the display panel 10 together. However, embodiments are not limited thereto. For example, the top case 167 may be inserted into grooves of the upper bar 75, the module cover 15, and the display panel 10.

In the display apparatus according to embodiments of the disclosure, the upper bar 75 may be coupled to the module cover 15 and the display panel 10. Hence, the module cover 15 and the display panel 10 can be prevented from being detached from the upper bar 75 and easily move up and down.

Further, in the display apparatus according to embodiments of the disclosure, the top case 167 may cover the upper bar 75, the module cover 15, and the display panel 10. Hence, the user can feel that the display apparatus has a neater appearance.

Referring to FIG. 11, the display apparatus according to the embodiment of the disclosure may be in a shape in which both sides of the upper bar 75 are supported by the support portion 73. The upper bar 75 may be moved up and down by the support portion 73. The support portion 73 may include an upper link 73a and a lower link 73b.

The upper link 73a and the lower link 73b may be connected to each other by a hinge 152. One end of the upper link 73a may be fastened to the upper bar 75, and the other end may be fastened to the hinge 152. One end of the lower link 73b may be fastened to the motor assembly 137, and the other end may be fastened to the hinge 152.

A guide bar 234 may be positioned at an entrance where the support portion 73 enters and exits the inside of the housing 30 while moving up and down. The guide bar 234 may include first and second guide bars 234a and 234b. The first and second guide bars 234a and 234b may face each other with the support portion 73 interposed between them.

For example, the first guide bar 234a may be positioned in front of the support portion 73, and the second guide bar 234b may be positioned in the rear of the support portion 73.

The panel roller 143 may be positioned at a front lower end of the support portion 73. At least one bracket 221 may be positioned on a portion of a bottom surface of the housing 30 corresponding to the panel roller 143. Namely, at least one bracket 221 may be positioned under the panel roller 143. The brackets 221 may be spaced apart from one another. At least one bracket 221 may be fixed to the bottom surface of the housing 30 through a screw.

The display apparatus according to the embodiment of the disclosure may include various structures for the drive therein. Thus, even if the display panel is moved up and down by the roller, the risk of failure of the display apparatus can be reduced.

Referring to FIG. 12, the display apparatus according to the embodiment of the disclosure may further include an apron roller 141 as well as the panel roller 143 inside the housing 30. The panel roller 143 may be positioned in front of the support portion 73, and the apron roller 141 may be positioned in the rear of the support portion 73. Namely, the panel roller 143 and the apron roller 141 may face each other with the support portion 73 interposed between them.

The panel roller 143 may wind and unwind the display panel 10, and the apron roller 141 may wind and unwind the module cover 15. In this instance, because the display panel 10 and the module cover 15 are wound and unwound by different rollers, they may not be attached to each other by the adhesive layer.

Because the module cover 15 is thicker than the display panel 10, the module cover 15 may occupy a lot of space inside the housing 30. Thus, the motor assembly 137 may be positioned in front of the support portion 73 so that it does not interfere with the winding and the unwinding of the module cover 15. However, embodiments of the disclosure are not limited thereto. For example, the motor assembly 137 may be positioned in the rear of the support portion 73.

Because the display panel 10 and the module cover 15 are dividedly wound and unwound inside the housing 30, a winding/unwinding force of the panel roller 143 and the apron roller 141 may be greater than an adhesive force between the display panel 10 and the module cover 15.

The display apparatus according to the embodiment of the disclosure can wind and unwind the display panel 10 and the module cover 15 using two rollers. Hence, the display panel 10 and the module cover 15 can be prevented from hanging because a smaller weight is applied to each roller.

Referring to FIG. 13, in the display apparatus according to embodiments of the disclosure, the panel roller 143 and the apron roller 141 may be positioned on the same side. For example, the panel roller 143 and the apron roller 141 may be positioned in the rear of the support portion 73. However, embodiments of the disclosure are not limited thereto. For example, the panel roller 143 and the apron roller 141 may be positioned in front of the support portion 73.

The apron roller 141 may be positioned under the panel roller 143. Because the module cover 15 is relatively thick, a diameter of the apron roller 141 may greatly increase when the module cover 15 is changed from the second state to the first state. Thus, the apron roller 141 may be spaced apart from the panel roller 143 by a first distance PGD or more so that the apron roller 141 does not contact the panel roller 143. The first distance PGD may be more than a distance that the apron roller 141 cannot contact the panel roller 143 when the module cover 15 is in the first state.

A guide roller 145 may be positioned on a line on which the apron roller 141 is released. The guide roller 145 may guide a location of the module cover 15 so that the guide roller 145 does not contact the panel roller 143 when the module cover 15 is in at least one of the first state and the second state. The guide roller 145 may be positioned under the panel roller 143 so that the module cover 15 does not contact the panel roller 143.

In the display apparatus according to embodiments of the disclosure, the panel roller 143 and the apron roller 141 may be positioned not to contact each other at the same side (for example, the upper and lower sides). Thus, space can be saved more than when the panel roller 143 and the apron roller 141 are positioned at the different sides.

Referring to FIG. 14, in the display apparatus according to embodiments of the disclosure, a pressure roller 147 may be positioned instead of the guide roller 145. The pressure roller 147 may press the module cover 15 so that the module cover 15 contacts the support portion 73. Hence, the module cover 15 may not bend and may maintain a flat state. The pressure roller 147 may be positioned adjacent to the support portion 73 in the third direction so that the module cover 15 contacts the support portion 73. The pressure roller 147 may also function to guide the module cover 15 so that the module cover 15 and the panel roller 143 do not contact each other.

In the display apparatus according to embodiments of the disclosure, the pressure roller 147 can press the module cover 15 so that the module cover 15 contacts the support portion 73. Hence, the users can be more immersed in the flat display panel 10.

Referring to FIG. 15, in the display apparatus according to embodiments of the disclosure, both a guide roller 145 and a pressure roller 147 may be positioned. Thus, the module cover 15 may not contact the panel roller 143 and may contact the support portion 73. As a result, malfunction of the display apparatus can be reduced, and the users can enjoy an image of the flat display panel 10.

Referring to FIG. 16, in the display apparatus according to embodiments of the disclosure, a third module cover 15c positioned on both sides of the module cover 15 may be attached to the display panel 10.

The third module cover 15c and the display panel 10 may be attached by a magnet 64 positioned on at least one apron. The magnet 64 may be attached to the apron using a double-sided tape. The magnet 64 may be positioned on each apron and attached to the display panel 10. The magnets 64 may be spaced apart from each other. Hence, the shape of the module cover 15 can be easily changed when the module cover 15 is wound or unwound by the roller.

The display panel 10 may be attached to the magnets 64. A surface of the display panel 10 contacting the magnets 64 may include Fe—Ni Invar alloy. Thus, the display panel 10 can be strongly attached to the magnets 64.

Because the display panel 10 and the module cover 15 are attached by the magnets 64 positioned only on both sides of the module cover 15, a large number of magnets 64 are not needed. As a result, the manufacturing cost of the display apparatus can be reduced.

Referring to FIG. 17, the magnet 64 may be positioned inside a recess 118 of the third module cover 15c.

The recess 118 may be positioned on a surface of the third module cover 15c facing the display panel 10. The recess 118 may be positioned on each apron. Because the magnet 64 is positioned inside the recess 118, a surface of the apron contacting the display panel 10 may be flat. As a result, the thickness of the display apparatus can be reduced, and the appearance of the display apparatus can be neater.

Referring to FIG. 18, as the display apparatus according to the embodiment of the disclosure is changed from the first state to the second state, the upper bar 75 may move up. As the support portion 73 positioned at both ends of the upper bar 75 pushes the upper bar 75 up and down, the upper bar 75 may move up and down.

As shown in (a) of FIG. 18, when the display apparatus is in the first state, an angle HRA between the upper link 73*a* and the lower link 73*b* may be very small. Hence, the upper bar 75 may not move up. Further, the display panel 10 and the module cover 15 may be wound on the panel roller 143.

As shown in (b) of FIG. 18, as the motor assembly 137 rotates, the angle HRA between the upper link 73*a* and the lower link 73*b* may increase. As the angle HRA between the upper link 73*a* and the lower link 73*b* increases, the upper bar 75 may move up. Hence, the display panel 10 and the module cover 15, that have been wound on the panel roller 143, may be gradually unwound.

As shown in (c) of FIG. 18, when the display apparatus is in the second state, the upper link 73*a* and the lower link 73*b* may be positioned in a straight line in parallel with each other. Namely, the angle HRA between the upper link 73*a* and the lower link 73*b* may be 180 degrees. Thus, the upper bar 75 may move up to a highest height. Further, the display panel 10 and the module cover 15 may be unwound from the panel roller 143.

FIGS. 19 to 35 illustrate a display apparatus according to an embodiment of the disclosure.

Referring to FIG. 19, the display unit 20 may have various aspect ratios. For example, the display panel 10 may have a first aspect ratio R1 and a second aspect ratio R2. The first aspect ratio R1 and the second aspect ratio R2 may be different from each other in a ratio of a first long side LS1 to a first short side SS1 exposed to the outside of the housing 30. A ratio of the first long side LS1 to the first short side SS1 in the first aspect ratio R1 may be 16:9, and a ratio of the first long side LS1 to the first short side SS1 in the second aspect ratio R2 may be 21:9. FIG. 19 illustrates only the first aspect ratio R1 and the second aspect ratio R2. However, embodiments are not limited thereto. The display unit 20 may have various aspect ratios of the first long side LS1 to the first short side SS1.

The display panel 10 may change an area of a portion, on which a display screen is displayed, depending on changes in the aspect ratio. Namely, the display panel 10 may determine a portion, on which the display screen is displayed, depending on the sensed aspect ratio.

As shown in (a) of FIG. 19, when the display unit 20 has the first aspect ratio R1, the display unit 20 may be in the second state. Namely, the angle HRA between the upper link 73*a* and the lower link 73*b* may be 180 degrees.

In this instance, the display panel 10 may display a display screen according to the first aspect ratio R1. Hence, the user can concentrate on the display screen of the first aspect ratio R1 in which a ratio value of the first long side LS1 is smaller than that in the second aspect ratio R2.

On the contrary, as shown in (b) of FIG. 19, when the display unit 20 has the second aspect ratio R2, there may be a predetermined angle between the upper link 73*a* and the lower link 73*b*.

In this instance, the display panel 10 may display a display screen according to the second aspect ratio R2. Hence, the user may display more information because a ratio value of the first long side LS1 in the second aspect ratio R2 is larger than that in the first aspect ratio R1.

Further, because the second aspect ratio R2 is a fullest ratio at which a person can view a display screen with his/her two eyes, the user's eyes may not be easily fatigued at the second aspect ratio R2.

The display apparatus 100 according to the embodiment of the disclosure may change a width, on which the display screen is displayed, according to an aspect ratio the user wants. Hence, the user adjusts the aspect ratio to an aspect ratio, at which he/she can most concentrate on the display screen, and thus can immerse in the display screen.

Referring to FIG. 20, the display apparatus may be powered on in S110. The display apparatus may include a controller. The controller may be driven to execute multiple application programs (or applications) driven in the display apparatus, data for an operation of the display device 100, and commands.

The controller typically controls the overall operation of the display apparatus in addition to operations associated with the application programs. The controller may provide or process appropriate information or functions to the user by processing signals, data, information, and the like input or output through the above-described components or by driving an application program stored in a memory.

When a power button of the display apparatus is pushed or touched, the controller may turn on the display apparatus. The controller may detect whether a previously set aspect ratio is present in a state where the display apparatus is turned on in S120. For example, a previously set input may be an aspect ratio the user has previously input. As another example, the previously set input may be an aspect ratio immediately before the display apparatus is turned off.

When the previously set aspect ratio is not present, the controller may receive a desired aspect ratio from the user in S130. When the previously set aspect ratio is present or an aspect ratio is input from the user, a link may be driven so that an aspect ratio of the display unit is the same as the set or input aspect ratio in S140. For example, as shown in FIG. 18, the aspect ratio of the display unit may be controlled by adjusting an angle between the upper link and the lower link.

The controller may detect whether the display unit has been driven by the set or input aspect ratio in S150. For example, the controller may detect whether the display unit has reached a desired aspect ratio through various methods to be described later.

In the display apparatus according to embodiments of the disclosure, the controller may drive the link in conformity with a predetermined aspect ratio when the predetermined aspect ratio is set or input. Hence, the user can more easily adjust the size of the display screen.

Referring to FIG. 21, the display apparatus may be powered off in S210. Namely, the controller may turn off the display apparatus. The controller may check a current aspect ratio of the display apparatus in S220. For example, the controller may check an aspect ratio of the display unit through various methods to be described later.

After the controller checks an aspect ratio of the display unit, the controller may drive the link so that at least a portion of the display unit is shielded by the housing in S230. For example, as shown in FIG. 18, the controller may drive the link so that at least a portion of the display unit is shielded inside the housing while reducing an angle between the upper link and the lower link.

The controller may detect whether the link has been driven so that the display unit is shielded inside the housing in S240. Namely, the controller may detect whether the link has been driven by an angle sufficient for the display unit to be shielded by the housing at the aspect ratio of the display unit when the display apparatus is powered off. When the link has not been driven by a desired angle, the controller may drive the link until the display unit is shielded.

Referring to FIG. 22, the controller may receive a desired aspect ratio from the user when the display apparatus is powered off in S310. Afterwards, the controller may detect a difference between the received aspect ratio and a current aspect ratio in S320. For example, the controller may detect an aspect ratio difference of the display unit through various methods to be described later.

After the controller detects the aspect ratio difference of the display unit, the controller may drive the link so that the aspect ratio of the display unit is the same as the desired aspect ratio in S330. For example, as shown in FIG. 18, the controller may control an aspect ratio until an angle between the upper link and the lower link at the current aspect ratio reaches an angle between the upper link and the lower link at the received desired aspect ratio.

The controller may detect whether the display unit has been driven by the desired aspect ratio in S340. Namely, the controller may detect whether the angle between the upper link and the lower link has reached a desired angle. When the link has not been driven by the desired aspect ratio, the controller may drive the link until the aspect ratio of the display unit reaches the desired aspect ratio.

In the display apparatus according to embodiments of the disclosure, the controller can freely control the aspect ratio received from the user.

Referring to FIG. 23, the controller may detect an aspect ratio of the display unit by an encoder 157. The encoder 157 may detect a rotation speed and/or a rotation angle of a motor 138 or a driver. The encoder 157 may be either an optical encoder or a magnetic encoder. The controller may adjust a drive of the motor 138 by the rotation speed and/or the rotation angle of the motor 138 or the driver detected by the encoder 157. In the display apparatus according to embodiments of the disclosure, the controller can easily detect the aspect ratio by the encoder 157.

The encoder 157 may be an incremental encoder. The incremental encoder may be a serial transmission scheme of phase A and phase B outputting two encoder signals with a phase difference of 90 degrees and phase Z outputting one pulse per revolution. Hence, the incremental encoder is low in manufacturing cost and can simplify communication lines.

On the contrary, the encoder 157 may be an absolute encoder. The absolute encoder may be a parallel transmission scheme requiring dozens of output lines depending on a required location and speed. Hence, the absolute encoder can detect accurate location information at any time. The user can detect the aspect ratio of the display unit using an appropriate type of encoder 157.

In the display apparatus according to embodiments of the disclosure, the encoder 157 may be connected to one end of the motor 138. The encoder 157 may transmit a pulse signal resulting from a rotation of the motor 138 to the controller and sense an amount of rotation of the motor 138. Hence, the controller can sense the angle HRA between the upper link 73a and the lower link 73b according to the rotation of the motor 138 to recognize a current aspect ratio of the display unit.

Referring to FIG. 24, in the display apparatus according to embodiments of the disclosure, the encoder 157 may be connected to one end of the lower link 73b. Namely, the encoder 157 may be connected to a rotation axis of the lower link 73b. The encoder 157 may transmit a pulse signal resulting from a rotation of the lower link 73b to the controller and sense a rotation angle of the lower link 73b. Hence, the controller can sense the angle HRA between the upper link 73a and the lower link 73b according to the rotation angle of the lower link 73b to recognize a current aspect ratio of the display unit.

When the encoder 157 is positioned at the motor, there may be an error in an angle of the lower link 73b according to an amount of rotation of the motor. Alternatively, when the encoder 157 is positioned at one end of the lower link 73b, it may detect up to a minute angle of the lower link 73b. Namely, when the encoder 157 is close to a portion where an actual operation occurs, the error can be reduced. Hence, the controller can adjust the upper link 73a and the lower link 73b so as to have an accurate aspect ratio.

In this instance, the screen can be prevented from being cut off due to an error in the aspect ratio of the display apparatus. Further, because upper and lower bezel areas have the same size, the user can easily concentrate on the display screen.

The encoder 157 may include an encoder disk 171 and at least one sensor 184. The encoder disk 171 may have a circular disk shape. The encoder disk 171 may be a portion attached to the rotation axis of the lower link 73b. The encoder disk 171 may rotate together as the lower link 73b rotates. The encoder disk 171 may include at least one slit 148 on its outer circumference. At least one slit 148 may have a bar shape that is recessed toward the center of the encoder disc 171.

At least one sensor 184 may be configured to surround the outer circumference of the encoder disk 171. At least one sensor 184 may sense a portion where at least one slit 148 is positioned.

At least one sensor 184 may include a light receiving unit positioned on one side of the encoder disc 171 and a light emitting unit positioned on the other side of the encoder disc 171. In a portion where at least one slit 148 is positioned, when a light source from the light emitting unit is incident on the encoder disk 171, light may be detected in the light receiving unit.

The sensor 184 may be an optical sensor as described above. However, embodiments are not limited thereto, and the sensor 184 may be a hall sensor. In this instance, the sensor 184 may detect a magnetic field.

Referring to FIG. 25, at least one slit 148 may have various shapes. As shown in (a) of FIG. 25, at least one slit 148 may have a circular shape penetrating the encoder disk 171. Although not shown, at least one slit 148 may have various shapes such as a quadrangle, a pentagon, and the like. As the shape of at least one slit 148 changes, it may be easier for the sensor to sense at least one slit 148.

As shown in (b) of FIG. 25, the encoder disk 171 may include a first portion 171a and a second portion 171b. The second portion 171b may protrude from the first portion 171a toward one side. The second portion 171b may have a ring shape with an empty central portion.

At least one slit 148 may be positioned on the second portion 171b and may have a bar shape that is recessed toward the first portion 171a. Because at least one slit 148 is recessed in a direction perpendicular to a diameter direction of the encoder disk 171, the sensor may be also positioned in the direction perpendicular to the diameter direction of the encoder disk 171. Hence, the user can determine a formation position of at least one slit 148 that makes it easier to install the sensor.

Referring to FIG. 26, in the display apparatus according to embodiments of the disclosure, the slit 148 may include a material different from the encoder disk 171. Namely, the slits 148 may not be a shape recessed toward the center of the encoder disk 171.

The slit 148 may include a magnetic material. In this instance, the sensor may be a hall sensor. In this instance, the sensor may control an aspect ratio of the display unit by detecting a magnetic field of at least one slit 148.

When the slit 148 is not in a shape recessed to the inside and includes a magnetic material, the magnetic material may be applied to a position to form the slit 148 if necessary or desired. Hence, a position of at least one slit 148 can be easily changed.

Referring to FIG. 27, in the display apparatus according to embodiments of the disclosure, one sensor 184 may be used. In this instance, an origin slit 148a, a first screen slit 148b, and a second screen slit 148c may be positioned on the encoder disk 171. The origin slit 148a, the first screen slit 148b, and the second screen slit 148c may be spaced from one another by a predetermined angle with respect to the encoder disk 171.

The origin slit 148a may be a portion, in which the sensor 184 is positioned, when the display unit is in the first state. The first screen slit 148b may be a portion, in which the sensor 184 is positioned, when the aspect ratio of the display unit is the second aspect ratio. The second screen slit 148c may be a portion, in which the sensor 184 is positioned, when the aspect ratio of the display unit is the first aspect ratio. However, embodiments are not limited thereto. At least one slit 148 may be positioned on the encoder disk 171 in conformity with various aspect ratios of the display unit.

For example, when the display unit changes from the first state to a state of the second aspect ratio, the controller may drive the encoder disk 171 in a counterclockwise direction (i.e., a first direction R1) and then may stop the drive of the encoder disk 171 when the sensor 184 senses one slit 148. As another example, when the display unit changes from the first state to a state of the first aspect ratio, the controller may drive the encoder disk 171 in the first direction R1 and then may stop the drive of the encoder disk 171 when the sensor 184 senses two slits 148. As another example, when the aspect ratio of the display unit changes from the second aspect ratio to the first aspect ratio, the controller may drive the encoder disk 171 in the first direction R1 and then may stop the drive of the encoder disk 171 when the sensor 184 senses one slit 148.

For example, when the display unit changes from a state of the second aspect ratio to the first state, the controller may drive the encoder disk 171 in the opposite direction (i.e., a second direction R2) of the first direction R1 and then may stop the drive of the encoder disk 171 when the sensor 184 senses one slit 148. As another example, when the display unit changes from a state of the first aspect ratio to the first state, the controller may drive the encoder disk 171 in the second direction R2 and then may stop the drive of the encoder disk 171 when the sensor 184 senses two slits 148. As another example, when the aspect ratio of the display unit changes from the first aspect ratio to the second aspect ratio, the controller may drive the encoder disk 171 in the second direction R2 and then may stop the drive of the encoder disk 171 when the sensor 184 senses one slit 148.

In the display apparatus according to embodiments of the disclosure, the encoder 157 may include one sensor 184. Hence, the encoder disk 171 and the sensor 184 can be manufactured at low cost.

The above embodiments described only the first and second aspect ratios, but are not limited thereto. Even if the set or input aspect ratio is variously changed, the embodiments can be implemented similar to the method described above.

Referring to FIG. 28, in the display apparatus according to embodiments of the disclosure, at least one slit 148 may be positioned on the entire outer circumference of the encoder disk 171. At least one slit 148 may be positioned to be spaced from the adjacent slit 148 by a predetermined distance SD. Separation distances between the slits 148 may be the same. However, embodiments are not limited thereto, and the separation distances between the slits 148 may be different from each other.

For example, the controller may confirm an aspect ratio of the display panel through the number of slits 148 sensed by the sensor 184. The controller may confirm an aspect ratio of the display panel and allow the display panel to display a screen suitable for the aspect ratio.

As another example, the controller may sense an amount of rotation of the encoder disk 171 sensed by the sensor 184 to confirm an aspect ratio of the display panel. In this instance, because a distance SD2 between the origin slit 148a and another slit 148 is greater than a distance SD1 between other slits 148, the sensor 184 may detect the number of times passing through the origin slit 148a. Hence, the controller may sense an amount of rotation of the encoder disk 171 according to the number of times the sensor 184 has passed through the origin slit 148a. The controller may confirm an aspect ratio of the display panel and allow the display panel to display a screen suitable for the aspect ratio.

FIG. 28 illustrates that the distance SD2 between the origin slit 148a and another slit 148 is greater than the distance SD1 between other slits 148, by way of example. However, embodiments are not limited thereto. For example, the distance SD2 between the origin slit 148a and another slit 148 may be less than the distance SD1 between other slits 148.

The display apparatus according to embodiments of the disclosure can detect not a specific aspect ratio but all of aspect ratios. Hence, the user can enjoy a display screen with the most appropriate aspect ratio resulting from a manual operation of the user rather than the specific aspect ratio.

Referring to FIG. 29, in the display apparatus according to embodiments of the disclosure, the sensor 184 may include a main sensor 184a and a sub-sensor 184b. In this instance, first and second origin slits 148fa and 148sa, a first screen slit 148b, and a second screen slit 148c may be positioned on the encoder disc 171. The first and second origin slits 148fa and 148sa, the first screen slit 148b, and the second screen slit 148c may be spaced from one another by a predetermined angle with respect to the encoder disc 171.

The first and second origin slits 148fa and 148sa may be portions corresponding to positions of the main sensor 184a and the sub-sensor 184b when the display unit is in the first state. The first and second origin slits 148fa and 148sa may be portions that are spaced from each other by 90 degrees with respect to the encoder disk 171. However, embodiments are not limited thereto. The first and second origin slits 148fa and 148sa can freely change depending on the positions of the main sensor 184a and the sub-sensor 184b in the first state.

In states other than the first state, the sub-sensor 184b may not pass through the slit 148. Namely, only in the first state, the main sensor 184a and the sub-sensor 184b may be simultaneously positioned on the slit 148. Hence, unlike the case where only one sensor 184 is used, a current state can be accurately recognized even when the power is turned off and on again in any one of the first and second states.

The first screen slit 148b may be a portion, in which the main sensor 184a is positioned, when the aspect ratio of the display unit is the second aspect ratio. The second screen slit 148c may be a portion, in which the main sensor 184a is positioned, when the aspect ratio of the display unit is the first aspect ratio. However, embodiments are not limited thereto. At least one slit 148 may be positioned on the encoder disk 171 in conformity with various aspect ratios of the display unit.

For example, when the display unit changes from the first state to a state of the second aspect ratio, the controller may drive the encoder disk 171 in a counterclockwise direction (i.e., a first direction R1) and then may stop an operation of the encoder disk 171 when the main sensor 184a senses one slit 148. As another example, when the display unit changes from the first state to a state of the first aspect ratio, the controller may drive the encoder disk 171 in the first direction R1 and then may stop the drive of the encoder disk 171 when the main sensor 184a senses two slits 148. As another example, when the aspect ratio of the display unit changes from the second aspect ratio to the first aspect ratio, the controller may drive the encoder disk 171 in the first direction R1 and then may stop the drive of the encoder disk 171 when the main sensor 184a senses one slit 148.

For example, when the display unit changes from a state of one of the first and second aspect ratios to the first state, the controller may drive the encoder disk 171 in the opposite direction (i.e., a second direction R2) of the first direction R1 and then may stop the drive of the encoder disk 171 when both the main sensor 184a and the sub-sensor 184b sense the slit 148. As another example, when the aspect ratio of the display unit changes from the first aspect ratio to the second aspect ratio, the controller may drive the encoder disk 171 in the second direction R2 and then may stop the drive of the encoder disk 171 when the main sensor 184a senses one slit 148.

Further, when a power failure occurs during the operation of the display apparatus or when the user disconnects the cord and then the power is turned on again, the controller may drive the encoder disk 171 in the opposite direction (i.e., the second direction R2) of the first direction R1 and then may stop the drive of the encoder disk 171 when both the main sensor 184a and the sub-sensor 184b sense the slit 148. Namely, when the power is turned off and then on again, the display apparatus may return to an initial position.

However, embodiments are not limited thereto. If the power is input to the display apparatus when a power failure occurs during the operation of the display apparatus or when the user disconnects the cord, the controller may drive the encoder disk 171 in the opposite direction (i.e., the second direction R2) of the first direction R1 even if the user does not turn on the power and then may stop the drive of the encoder disk 171 when both the main sensor 184a and the sub-sensor 184b sense the slit 148.

Hence, the embodiment of the disclosure can prevent a damage resulting from an excessive rise movement of the display unit which is not at the initial position.

The above embodiments described only the first and second aspect ratios, but are not limited thereto. Even if the set or input aspect ratio is variously changed, the embodiments can be implemented similar to the method described above.

The user may allow the sensor 184 to be positioned in a portion, in which the slit 148 of the encoder disk 171 is not positioned, using a remote controller or a button. Namely, the user may change the aspect ratio of the display unit to aspect ratios other than the first and second aspect ratios.

The controller may move the encoder disc 171 using the remote controller so that the changed aspect ratio becomes the first and second aspect ratios. For example, when the user changes the display unit from a state where the main sensor 184a is positioned between the first screen slit 148b and the second screen slit 148c to the first state using the remote controller, the controller may drive the encoder disk 171 in the second direction R2 and then may stop the drive of the encoder disk 171 when both the main sensor 184a and the sub-sensor 184b sense the slit 148. As another example, when the user changes the display unit from a state where the main sensor 184a is positioned between the first screen slit 148b and the second screen slit 148c to a state of the second aspect ratio using the remote controller, the controller may drive the encoder disk 171 in the second direction R2 and then may stop the drive of the encoder disk 171 when the main sensor 184a senses one slit 148. As another example, when the user changes the display unit from a state where the main sensor 184a is positioned between the first screen slit 148b and the second screen slit 148c to a state of the first aspect ratio using the remote controller, the controller may drive the encoder disk 171 in the first direction R1 and then may stop the drive of the encoder disk 171 when the main sensor 184a senses one slit 148.

The display apparatus according to embodiments of the disclosure can automatically set an aspect ratio of the display unit to the first and second aspect ratios using the controller even if the user accurately sets the aspect ratio of the display unit to the first and second aspect ratios by adjusting the remote controller or the button.

Referring to FIGS. 30 to 32, the encoder 157 may be positioned corresponding to a portion where the display panel 10 and the module cover 15 are unwound from the panel roller 143. The encoder 157 may be spaced from the display unit 20 by a predetermined distance and may be positioned not to interfere with the winding and the unwinding of the display unit 20. The encoder 157 may include a pillar 136 and at least one apron sensor 135. The pillar 136 may support at least one apron sensor 135. At least one apron sensor 135 may protrude from the pillar 136 toward the module cover 15. At least one apron sensor 135 may sense each of aprons constituting the module cover 15.

As shown in FIG. 30, when the display panel 10 and the module cover 15 are wound and unwound by one roller, the encoder 157 may be positioned corresponding to a portion where the display unit 20 is unwound from the panel roller 143. As shown in FIG. 31, when the display panel 10 and the module cover 15 are positioned on opposite sides of the support portion 73 and are wound and unwound by two rollers, the encoder 157 may be positioned corresponding to a portion where the module cover 15 is unwound from the roller. As shown in FIG. 32, when the display panel 10 and the module cover 15 are positioned on the same side of the support portion 73 and are wound and unwound by two rollers, the encoder 157 may be positioned corresponding to a portion where the display panel 10 and the module cover 15 contact each other.

In other words, the encoder 157 may be positioned corresponding to a portion where the module cover 15 is unwound from the panel and is extended in one direction. In this instance, a space may be formed between the aprons immediately before the module cover 15 is extended in one direction, and thus the apron sensor 135 may sense the apron passing through the apron sensor 135.

Referring to (a) of FIG. 33, the apron sensor 135 of the encoder 157 may be a hall sensor. In this instance, the apron sensor 135 may sense a magnetic field of a magnet 231 positioned on each apron 166. The controller may check how much the display unit is unwound from the roller through the number of magnetic fields of the magnets 231 sensed by the apron sensor 135.

Referring to (b) of FIG. 33, the apron sensor 135 of the encoder 157 may be a photo sensor. In this instance, a distance between the module cover 15 and the apron sensor 135 may vary depending on a distance between the aprons 166 generated when each apron 166 is unwound. The controller may check how much the display unit is unwound from the roller through the number of times passing through a space between the aprons 166 sensed by the apron sensor 135.

When the encoder 157 senses the apron 166 of the module cover 15, an aspect ratio can be adjusted more accurately than when the aspect ratio is adjusted by sensing an amount of rotation of the motor or a rotation angle of the lower link.

Referring to FIG. 34, the encoder 157 may be positioned at the center of the display apparatus according to embodiments of the disclosure in the left-right direction. The encoder 157 may be fixed to the bottom of the housing 30. The encoder 157 may include a wire 246. The wire 246 may be wound and unwound from a body 248 of the encoder 157. The wire 246 may be fixed to an upper end of the display unit 20 and may be wound and unwound in conjunction with the display unit 20. In this instance, the controller may sense a length of the wire 246 that is wound and unwound from the body 248 of the encoder 157, and thus may adjust an aspect ratio of the display unit 20.

For example, the controller may stop a drive of the motor when the wire 246 is unwound from the body 248 of the encoder 157 by the length of the wire 246 that is matched to the set or input aspect ratio of the display unit 20.

The encoder 157 may be spaced from a lower side of the panel roller 143, and an encoder guide 314 may be positioned at a lower side of a portion, in which the display panel is unwound, so that the encoder 157 does not interfere with the winding and the unwinding of the display panel. Namely, the encoder guide 314 may guide so that the wire 246 is not in contact with the display panel.

FIG. 34 illustrates that the encoder 157 is be positioned at the center of the display apparatus in the left-right direction, by way of example. However, embodiments are not limited thereto. The encoder 157 may be positioned on both sides of the display apparatus.

Referring to FIG. 35, a depression 363 may be formed at a portion corresponding to the wire 246 of the encoder 157 so that the wire 246 is inserted between the display panel 10 and the module cover 15. For example, the depression 363 may be positioned at the center of the module cover 15 in the left-right direction. The depression 363 may have a shape extending in a up-down direction of the module cover 15. The depression 363 may have a shape recessed to the inside of the module cover 15.

The wire 246 may be inserted into the depression 363 and may be wound and unwound in conjunction with the display unit. Hence, the wire 246 may not prevent the display panel 10 and the module cover 15 from being in contact with each other and being wound and unwound.

The figures illustrated the structure of the display apparatus in which the display unit is rolled up from the inside of the housing. However, embodiments are not limited thereto. The figures may be applied to a structure of the display apparatus in which the display unit is rolled down to the inside of the housing.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

What is claimed is:

1. A display apparatus comprising:
   a housing;
   at least one roller positioned inside the housing;
   a display unit including a display panel and a module cover;
   a driver including a motor assembly, an upper bar coupled to an upper part of the display unit, and at least one support portion having one side coupled to both ends of the upper bar and another side coupled to the motor assembly, the at least one support portion moving the upper bar up and down; and
   an encoder positioned inside the housing and spaced from the at least one roller,
   wherein the display panel and the module cover are in a first state, in which they are wound on the at least one roller, or a second state in which they are unwound from the at least one roller, are in contact with each other, and are exposed to an outside of the housing,
   wherein the at least one support portion includes:
   an upper link of which one end is coupled to the upper part;
   a lower link of which one end is coupled to the motor assembly; and
   a hinge connecting the upper link to the lower link,
   wherein the encoder is coupled to a rotation axis of one end of the lower link, and
   wherein the encoder includes:
   an encoder disk coupled to the lower link; and
   a sensor surrounding an outer circumference of the encoder disk.

2. The display apparatus of claim 1, wherein the encoder disk includes a slit having a bar shape on the outer circumference, wherein the slit includes a magnetic material.

3. The display apparatus of claim 2, wherein the sensor is one of an optical sensor and a hall sensor.

4. The display apparatus of claim 1, wherein the encoder disk includes at least one slit that is recessed from the outer circumference to a center of the encoder disk.

5. The display apparatus of claim 4, wherein the at least one slit has a bar shape or a circular shape.

6. The display apparatus of claim 4, wherein the at least one slit includes:
   an origin slit;
   a first screen slit spaced from the origin slit by a predetermined angle; and
   a second screen slit spaced from the first screen slit by a predetermined angle.

7. The display apparatus of claim 6, wherein the sensor is positioned on the second screen slit at a first aspect ratio and is positioned on the first screen slit at a second aspect ratio.

8. The display apparatus of claim 7, wherein in the first aspect ratio, a ratio of a long side to a short side of the display panel is 16:9,
   wherein in the second aspect ratio, a ratio of a long side to a short side of the display panel is 21:9.

9. The display apparatus of claim 6, further comprising a controller configured to transmit a control signal,
   wherein when the first state changes to the second state, the controller transmits a control signal that stops a drive of the driver when the sensor senses the at least one slit.

10. The display apparatus of claim 4, wherein the sensor includes:
   a main sensor; and
   a sub-sensor spaced from the main sensor by a predetermined angle,
   wherein the at least one slit includes:
   first and second origin slits spaced from each other by a predetermined angle;
   a first screen slit spaced from the second origin slit by a predetermined angle; and
   a second screen slit spaced from the first screen slit by a predetermined angle.

11. The display apparatus of claim 10, wherein the main sensor and the sub-sensor in the first state are positioned in portions corresponding to the first and second origin slits.

12. The display apparatus of claim 10, wherein the at least one sensor is configured such that only the main sensor in the second state is positioned in a portion corresponding to the at least one slit.

13. The display apparatus of claim 10, further comprising a controller configured to transmit a control signal,
   wherein when the first state changes to the second state, the controller transmits a control signal that stops a drive of the driver when the main sensor senses the at least one slit.

14. The display apparatus of claim 10, further comprising a controller configured to transmit a control signal,
   wherein when the second state changes to the first state, the controller transmits a control signal that stops a drive of the driver when both the main sensor and the sub-sensor sense the slit.

* * * * *